US011352692B2

United States Patent
Ago et al.

(10) Patent No.: US 11,352,692 B2
(45) Date of Patent: Jun. 7, 2022

(54) HEXAGONAL BORON NITRIDE THIN FILM AND METHOD FOR PRODUCING THE SAME

(71) Applicant: JAPAN SCIENCE AND TECHNOLOGY AGENCY, Saitama (JP)

(72) Inventors: Hiroki Ago, Fukuoka (JP); Kenji Kawahara, Fukuoka (JP); Yuki Uchida, Fukuoka (JP); Sho Nakandakari, Fukuoka (JP); Daichi Tanaka, Fukuoka (JP)

(73) Assignee: JAPAN SCIENCE AND TECHNOLOGY AGENCY, Saitama (JP)

( * ) Notice: Subject to any disclaimer, the term of this patent is extended or adjusted under 35 U.S.C. 154(b) by 268 days.

(21) Appl. No.: 16/475,498

(22) PCT Filed: Jan. 5, 2018

(86) PCT No.: PCT/JP2018/000107
§ 371 (c)(1),
(2) Date: Jul. 2, 2019

(87) PCT Pub. No.: WO2018/128193
PCT Pub. Date: Jul. 12, 2018

(65) Prior Publication Data
US 2019/0345603 A1 Nov. 14, 2019

(30) Foreign Application Priority Data
Jan. 6, 2017 (JP) .............................. JP2017-001291

(51) Int. Cl.
*C23C 16/34* (2006.01)
*H01L 29/786* (2006.01)

(52) U.S. Cl.
CPC .......... *C23C 16/342* (2013.01); *H01L 29/786* (2013.01)

(58) Field of Classification Search
None
See application file for complete search history.

(56) References Cited

U.S. PATENT DOCUMENTS 8,790,775 B2 * 7/2014 Kim ...................... C30B 29/40
428/336
2011/0256386 A1 10/2011 Shi et al.
(Continued)

FOREIGN PATENT DOCUMENTS

CN 103774113 10/2015
JP 2013-067549 4/2013
(Continued)

OTHER PUBLICATIONS

Lu et al "Synthesis of large single-crystal hexagonal boron nitride grains on Cu—Ni alloy" Nature Communications, 6, Art. 6160 (2015) (Year: 2015).*
(Continued)

*Primary Examiner* — Mandy C Louie
(74) *Attorney, Agent, or Firm* — Wenderoth, Lind & Ponack, L.L.P.

(57) ABSTRACT

The present invention is to provide: a method for producing a novel hexagonal boron nitride thin film suitable for industrial use such as application to electronics, in which a hexagonal boron nitride thin film having a large area, a uniform thickness of 1 nm or more, with few grain boundaries can be produced inexpensively; and a hexagonal boron nitride thin film. The hexagonal boron nitride thin film according to the present invention is characterized by having a thickness of 1 nm or more, and an average value of the full (Continued)

width at half maximum of the $E_{2g}$ peak obtained from Raman spectrum of 9 to 20 cm$^{-1}$.

16 Claims, 30 Drawing Sheets

(56) References Cited

U.S. PATENT DOCUMENTS

| | | |
|---|---|---|
| 2013/0099195 A1 | 4/2013 | Seacrist et al. |
| 2013/0140526 A1 | 6/2013 | Kim et al. |
| 2013/0230722 A1 | 9/2013 | Fujii et al. |
| 2014/0264282 A1 | 9/2014 | Lee et al. |
| 2014/0287244 A1 | 9/2014 | Shin et al. |
| 2016/0281221 A1 | 9/2016 | Kim et al. |

FOREIGN PATENT DOCUMENTS

| | | | |
|---|---|---|---|
| JP | 2013-516083 | 5/2013 | |
| WO | 2009/119641 | 10/2009 | |
| WO | WO2009119641 | * 10/2009 | ............. B82Y 30/00 |
| WO | 2011/090571 | 7/2011 | |
| WO | 2012/070385 | 5/2012 | |
| WO | 2014/182540 | 11/2014 | |

OTHER PUBLICATIONS

Roland Yingjie Tay et al., "Growth of Large Single-Crystalline Two-Dimensional Boron Nitride Hexagons on Electropolished Copper," Nano Letters, 2014, vol. 14, No. 2, pp. 839-846.

Li Song et al., "Large Scale Growth and Characterization of Atomic Hexagonal Boron Nitride Layers," Nano Letters, 2010, vol. 10, No. 8, pp. 3209-3215.

Justin C. Koepke et al., "Role of Pressure in the Growth of Hexagonal Boron Nitride Thin Films from Ammonia-Borane," Chemistry of Materials, 2016, vol. 28, No. 12, pp. 4169-4179, with supporting information.

Extended European Search Report dated Jun. 29, 2020 in corresponding European Patent Application No. 18735883.3.

International Search Report dated Apr. 3, 2018 in International Application No. PCT/JP2018/000107.

P. X. Feng et al., "Few-atomic-layer boron nitride sheets syntheses and applications for semiconductor diodes", Materials Letters, 2012, 89, pp. 206-208.

Hexagonal BN epitaxial growth by FME on low-temperature grown h-BN buffer layer, vol. 1, 2009, p. 384, lecture No. 30p-ZJ-1, non-official translation (Lecture Proceedings of the 56th JSAP Related Union Meeting, background, growth, results and investigations).

Notice of Reasons for Refusal dated Jun. 29, 2021 in corresponding Japanese Patent Application No. 2018-560410, with an English translation.

Sung Kyu Jang et al., "Synthesis and Characterization of Hexagonal Boron Nitride as a Gate Dielectic", Scientific Reports, Jul. 26, 2016, vol. 6, pp. 1-9.

Soo Min Kim et al., "Synthesis of large-area multilayer hexagonal boron nitride for high material performance", Nature Communications, Oct. 28, 2015, vol. 6, pp. 1-11.

Notice of Reasons for Refusal dated Feb. 8, 2022 in corresponding Japanese Patent Application No. 2018-560410, with an English translation.

* cited by examiner (a)

(b)

(a)

(b)

(c)

(a)

(b)

(c)

(a)

(b)

(c)

(a)

(b)

(c)

(d)

(a)

(b)

(a)

(b)

HEXAGONAL BORON NITRIDE THIN FILM AND METHOD FOR PRODUCING THE SAME

TECHNICAL FIELD

The present invention relates to a hexagonal boron nitride thin film and a method for producing the hexagonal boron nitride thin film, and a laminated body containing the hexagonal boron nitride thin film, and more specifically relates to a hexagonal boron nitride thin film using a metal film as a catalyst and a method for producing the hexagonal boron nitride thin film.

BACKGROUND ART

Hexagonal boron nitride (h-BN) has a layered structure consisting of a hexagonal lattice in which boron atoms and nitrogen atoms are alternately arranged, and a bulk crystal contains vertically stacked, a large number of the layers. The hexagonal boron nitride has a large bandgap of 5.9 eV and is an excellent insulator. Further, the hexagonal boron nitride has high flatness at the atomic level.

From such a feature, it is known that a hexagonal boron nitride thin film exhibits excellent characteristics as an insulating substrate of a two-dimensional atomic layered material such as graphene. For example, graphene is made into a device by attaching electrodes on a silicon oxide substrate, and when the carrier mobility is measured, a value of 2,000 to 20,000 $cm^2/Vs$ is obtained, but on the other hand it is known that by inserting a hexagonal boron nitride thin film having a thickness of around 10 nm between graphene and a silicon oxide substrate, the carrier mobility can be improved up to 15,000 to 60,000 $cm^2/Vs$.

It is known that also in an atomic film of a layered material of a transition metal and chalcogen such as sulfur, which is referred to as a transition metal chalcogenide, the characteristics are greatly improved by a hexagonal boron nitride thin film. For example, it has been reported that by sandwiching a two-dimensional atomic film of molybdenum disulfide with two sheets of hexagonal boron nitride thin films, the carrier mobility of molybdenum disulfide is increased up to 34,000 $cm^2/Vs$ at a low temperature of 10 K. In addition, it has been reported that by arranging a hexagonal boron nitride thin film under tungsten disulfide, the fluorescence intensity of the tungsten disulfide is increased, and the full width at half maximum of the emission peak is significantly decreased. On a silicon oxide substrate, surface irregularities, optical phonon, and charge impurities on the surface are present, and these lead to the deterioration in the properties of a two-dimensional atomic layered material on the silicon oxide substrate. In contrast, a hexagonal boron nitride thin film can screen such influence, and leads to the significant improvement in the electrical and optical properties of the two-dimensional material. For this reason, a hexagonal boron nitride thin film is ideal as an insulating substrate for a variety of atomic layered materials.

Almost all of the conventional hexagonal boron nitride thin films to be used in such applications are made by exfoliation from small bulk crystals of hexagonal boron nitride. High temperature and high pressure are required for the synthesis of hexagonal boron nitride single crystal, and further, the transferred hexagonal boron nitride thin film exfoliated from the crystal has an extremely small size of around 1 µm, and the thickness and shape are difficult to be controlled. Therefore, the industrial application of the hexagonal boron nitride as an insulating film has been considered to be extremely difficult.

Under such a circumstance, as an alternative to the exfoliation from bulk crystals, it has been proposed to synthesize a film of boron nitride on a surface of a substrate by a chemical vapor deposition (CVD) method or the like.

For example, in Patent Literature 1, it has been proposed that a single crystal structure is formed on a surface of a substrate made of a chemically soluble metal or a metal compound, and a single atomic film of h-BN having a single atom thickness is formed on a surface of the single crystal by a CVD method in which a raw material gas is brought into contact with the surface of the single crystal.

Further, in Patent Literature 2, it has been proposed that a surface of a substrate made of a metal or a metal compound is polished so as to have a surface roughness ($R_{max}$) of 5 nm or less, and then by using the polished surface as a template, a h-BN thin film composed of a one-atomic layer or two-atomic layers is formed on the surface of the substrate.

In addition, in Patent Literature 3, it has been described that with regard to a method for forming a layer of graphene on a semiconductor substrate, a layer of boron nitride is contained between the substrate and the graphene layer, and further it has been described that this layer of boron nitride is a single layer or a continuous layer of two or more layers of boron nitride each having a single atom thickness. In this regard, in Patent Literature 3, it has been described that a metal film is formed on a front surface of a semiconductor substrate, and a layer of graphene and a layer of boron nitride are formed between the front surface of the semiconductor substrate and the back surface of the metal film.

CITATION LIST

Patent Literature

Patent Literature 1: WO 2009/119641
Patent Literature 2: JP 2013-67549 A
Patent Literature 3: WO 2014/182540
Patent Literature 4: US 2014/0264282 A
Patent Literature 5: US 2014/0287244 A

Non Patent Literature

Non Patent Literature 1: S. K. Jang et al. Sci. Rep., 6, 30449 (2016).
Non Patent Literature 2: S. M. Kim et al., Nat. Commun., 6, 9662 (2015).

SUMMARY OF INVENTION

Technical Problem

However, as described in Patent Literatures 1 to 3, most of the films of hexagonal boron nitride that have been reported so far are single layer with one atom thickness and double layer with two-atom thickness, and have a thickness of less than 1 nm, and thus the films are insufficient to shield influence of a surface of a substrate such as silicon oxide. That is, with a film of hexagonal boron nitride having a thickness of less than 1 nm, an influence of the surface roughness of silicon oxide, the Coulomb potential of charged impurities, or the like cannot be sufficiently reduced. Further, for example, in a case where a thin film having multiple layers formed by stacking several boron nitride layers, there is a concern that the expected performance may not be exerted due to, for example, the contamination by impurities in the process of repeatedly depositing the one-atomic layer of boron nitride on a substrate.

On the other hand, in a report of synthesis of a thin film of hexagonal boron nitride having some thickness (Non Patent Literature 1), molecules containing boron and nitrogen are allowed to react with each other in a gas phase and be deposited on a substrate, and therefore, the crystallinity of the hexagonal boron nitride is low, and the grain size is extremely small with less than 10 to 100 nm. Further, in this case, the thickness of the thin film is very nonuniform.

In addition, recently, it has been reported that a hexagonal boron nitride thin film having high crystallinity can be synthesized by using a Fe foil as a catalyst (Non Patent Literature 2). In this case, boron and nitrogen are dissolved in a Fe foil, and precipitated at a cooling rate of 5° C./min to generate hexagonal boron nitride. Although the hexagonal boron nitride thin film obtained by this method has high crystallinity, the thickness is nonuniform, and therefore, this hexagonal boron nitride thin film is insufficient for the application to an electronic device. This is because the Fe foil is polycrystalline with a large number of crystal grain boundaries, and further, the control of the amounts of dissolved boron and nitrogen atoms in Fe is difficult.

In Patent Literature 4, it has been described that with regard to a layer structure in which a h-BN sheet is synthesized by using a Cu foil (metal substrate) having a thickness of around 125 μm as a catalyst, and a graphene sheet is formed on the h-BN sheet, the thickness of the obtained graphene sheet and h-BN sheet was around 2 nm in total, however, no evidence has been shown regarding the uniformity of the film thickness of the h-BN sheet.

In Patent Literature 5, it has been proposed to prepare a substrate assembly in which a metal layer of Ni or the like is formed on a hexagonal boron nitride sheet that has been formed on a silicon substrate by a drop casting method, or a substrate assembly in which gas-state or solid-state boron and nitrogen sources are allowed to pass through multiple grain boundaries existed in a metal layer that has been formed on a silicon substrate in advance, and a hexagonal boron nitride sheet is formed between the metal layer and the substrate. However, the hexagonal boron nitride sheet formed by a drop casting method using an ammonia borane solution in a Ni layer formed on the silicon substrate is only considered to contain a relatively uniform surface in an atomic force microscope image, and no evidence has been obtained regarding the uniformity of the entire film surface or the uniformity of the film thickness.

Therefore, in spite of various attempts so far as described above, a hexagonal boron nitride thin film at a level of withstanding the practical application of an atomic layered material is still not obtained, and a method for producing a hexagonal boron nitride thin film that has a large area, a thickness of 1 nm or more, high crystallinity, and a uniform thickness has been demanded.

The present invention is made in consideration of the above circumstances, and an object of the present invention is to provide: a method for producing a novel hexagonal boron nitride thin film suitable for industrial use such as application to electronics, in which a hexagonal boron nitride thin film having a large area, a uniform thickness of 1 nm or more, and few grain boundaries can be produced inexpensively; and a hexagonal boron nitride thin film.

Solution to Problem

The hexagonal boron nitride thin film according to the present invention is characterized by having a thickness of 1 nm or more and an average value of a full width at half maximum of an $E_{2g}$ peak obtained from a Raman spectrum of 9 to 20 cm$^{-1}$.

In a preferred embodiment, the hexagonal boron nitride thin film has a coefficient of variation of an intensity distribution of a G component of a red green and blue (RGB) image obtained with an optical microscope of 5% or less.

Further, in a preferred embodiment, in the hexagonal boron nitride thin film, the intensity distribution of the G component is unimodal.

Furthermore, in a preferred embodiment, the hexagonal boron nitride thin film has a thickness of 1 nm or more and 50 nm or less.

In addition, in a preferred embodiment, the hexagonal boron nitride thin film consists of three or more layers.

The method for producing a hexagonal boron nitride thin film according to the present invention is characterized by including a step of forming a film of boron nitride having a thickness of 1 nm or more on a surface of a metal thin film by contacting raw material gas containing boron atoms, nitrogen atoms, or both of boron atoms and nitrogen atoms with the surface of the metal thin film.

In a preferred embodiment in the method for producing a hexagonal boron nitride thin film, the metal thin film contains at least one or more elements selected from the group consisting of Fe, Ni, Co, Cu, and Cr as main component elements.

In a preferred embodiment in the method for producing a hexagonal boron nitride thin film, the metal thin film contains two or more elements as main component elements.

In a preferred embodiment in the method for producing a hexagonal boron nitride thin film, the metal thin film contains Ni and Fe, Co and Fe, or Cr and Fe as main component elements.

In a preferred embodiment in the method for producing a hexagonal boron nitride thin film, the metal thin film contains Ni and Fe as main component elements, and a surface of the metal thin film has a (111) plane, a (100) plane, or a (110) plane of a face-centered cubic lattice.

In a preferred embodiment in the method for producing a hexagonal boron nitride thin film, the metal thin film contains 10% or more of Ni.

In a preferred embodiment in the method for producing a hexagonal boron nitride thin film, a hexagonal boron nitride thin film is formed by a chemical vapor deposition (CVD) method.

In a preferred embodiment in the method for producing a hexagonal boron nitride thin film, a second raw material gas containing boron atoms or nitrogen atoms is further supplied.

In a preferred embodiment in the method for producing a hexagonal boron nitride thin film, a hexagonal boron nitride thin film having a thickness of 1 nm or more and less than 50 nm is formed.

In a preferred embodiment in the method for producing a hexagonal boron nitride thin film, a hexagonal boron nitride thin film consisting of three or more layers is formed.

The stacked body including a hexagonal boron nitride thin film according to the present invention is characterized by containing the hexagonal boron nitride thin film described above.

The thin film transistor according to the present invention is characterized by using the stacked body described above.

The electronic device according to the present invention is characterized by containing the thin film transistor described above.

Advantageous Effects of Invention

According to the present invention, by using a stacked film being metal films of two or more components or a thin film being a metal alloy of two or more components as a catalyst, the stacked film or the thin film has been deposited on a single crystal substrate which is relatively inexpensive and having a large area, such as magnesium oxide (MgO), sapphire ($\alpha$-Al$_2$O$_3$), spinel (MgAl$_2$O$_4$), or quartz crystal (SiO$_2$), or by using a foil of a metal alloy of two or more components as a catalyst, the catalyst is brought into contact with a gas containing boron and nitrogen to react the metal catalyst with the gas, so that a hexagonal boron nitride thin film having a large area, a uniform thickness, and high crystallinity can be obtained.

Further, according to the present invention, a thin film of hexagonal boron nitride, which is high quality and has a uniform thickness, can be obtained in a large area and at a low cost, and a novel hexagonal boron nitride thin film suitable for industrial use of various atomic layered materials such as graphene, a transition metal chalcogenide, black phosphorus, and silicene is provided.

BRIEF DESCRIPTION OF DRAWINGS

FIG. 2(a): Fe/MgO (100), FIG. 2(b): Ni/MgO (100), FIG. 2(c): Fe$_{0.7}$—Ni$_{0.3}$/MgO (100) (Ni=30%), FIG. 2(d): Fe$_{0.3}$—Ni$_{0.7}$/MgO (100) (Ni=70%), and FIG. 2(e): Fe foil. The scale bar in each image is 20 μm.

FIG. 3(a): Fe/MgO (100), FIG. 3(b): Ni/MgO (100), FIG. 3(c): Fe$_{0.7}$—Ni$_{0.3}$/MgO (100) (Ni=30%), FIG. 3(d): Fe$_{0.3}$—Ni$_{0.7}$/MgO (100) (Ni=70%), and FIG. 3(e): Fe foil. The scale bar in each image is 100 μm.

FIGS. 4A(a) and 4A(c): h-BN synthesized by using Fe/MgO (100), and FIGS. 4A(b) and 4A(d): h-BN synthesized by using Ni/MgO (100). The wave numbers in the Raman spectrum represent the center wave number and the full width at half maximum of the E$_{2g}$ peak derived from the h-BN.

FIGS. 4B(a) and 4B(c): h-BN synthesized by using Fe$_{0.7}$—Ni$_{0.3}$/MgO (100) (Ni=30%), and FIGS. 4B(b) and 4B(d): h-BN synthesized by using Fe$_{0.3}$—Ni$_{0.7}$/MgO (100) (Ni=70%). The wave numbers in the Raman spectrum represent the position and the full width at half maximum of the E$_{2g}$ peak derived from the h-BN.

FIG. 5(a): Fe$_{0.7}$—Ni$_{0.3}$/MgO (100) (Ni=30%), and FIG. 5(b): Fe$_{0.3}$—Ni$_{0.7}$/MgO (100) (Ni=70%).

FIG. 6 is a histogram showing distribution of the full width at half maximum of the E$_{2g}$ peak.

FIG. 7(a): Fe/MgO (100), FIG. 7(b): Ni/MgO (100), FIG. 7(c): Fe$_{0.7}$—Ni$_{0.3}$/MgO (100) (Ni=30%), FIG. 7(d): Fe$_{0.3}$—Ni$_{0.7}$/MgO (100) (Ni=70%), and FIG. 7(e): color charts showing crystal orientation of $\alpha$-Fe and Ni.

FIG. 8(a): Fe/MgO (100), FIG. 8(b): Ni/MgO (100), FIG. 8(c): Fe$_{0.7}$—Ni$_{0.3}$/MgO (100) (Ni=30%), and FIG. 8(d): Fe$_{0.3}$—Ni$_{0.7}$/MgO (100) (Ni=70%). FIG. 8(e): a height profile of a sample of FIG. 8(d).

FIG. 10(a) shows an optical microscope image (at low magnification, and the scale bar in the image is 100 μm), FIG. 10(b) shows an optical microscope image (at high magnification, and the scale bar in the image is 20 μm), and FIG. 10(c) shows an atomic force microscope image (the scale bar in the image is 10 μm).

FIG. 13 is a histogram showing distribution of the full width at half maximum of the E$_{2g}$ peak.

FIG. 17(a) shows graphs showing intensity distribution of G components extracted from RGB images, and FIG. 17(b) shows images of G components of the RGB images obtained with an optical microscope.

FIG. 18(a): 5° C./min, FIG. 18(b): 2.5° C./min, and FIG. 18(c): 1° C./min. The scale bar in each image is 20 μm.

FIG. 19(a): super invar, FIG. 19(b): 42 invar, and FIG. 19(c): 78 permalloy. The scale bar in each image is 20 μm.

FIG. 20(a): super invar, FIG. 20(b): 42 invar, and FIG. 20(c): 78 permalloy. The scale bar in each image is 20 μm.

FIG. 21(a): cooled to 700° C. at 5° C./min, FIG. 21(b): cooled to 700° C. at 1° C./min, FIG. 21(c): cooled to 900° C. at 0.5° C./min and cooled to 700° C. at 5° C./min, and FIG. 21(d): cooled to 1050° C. at 0.25° C./min and cooled to 700° C. at 5° C./min. The scale bar in each image is 20 μm.

FIG. 22(b) shows a histogram showing distribution of the full width at half maximum of the $E_{2g}$ peak.

FIG. 23(a): 1100° C. (at high magnification), FIG. 23(b): 1150° C. (at high magnification), FIG. 23(c): 1100° C. (at low magnification), and FIG. 23(d): 1150° C. (at low magnification). The scale bar in each of FIGS. 23(a) and 23(b) is 20 μm, and the scale bar in each of FIGS. 23(c) and 23(d) is 100 μm.

FIG. 25(a): $WS_2$ synthesized on the h-BN, and FIG. 25(b): $WS_2$ synthesized on the $SiO_2$/Si substrate.

FIG. 26(a): $WS_2$ synthesized on the h-BN, and FIG. 26(b): $WS_2$ synthesized on the $SiO_2$/Si substrate.

FIGS. 28(a) and 28(b) show measurement results of Raman spectra of the single layer graphene stacked on the h-BN synthesized by using a super invar foil, and the single layer graphene transferred onto $SiO_2$/Si. FIG. 28(a): graphene on the $SiO_2$/Si, and FIG. 28(b): graphene on the h-BN.

DESCRIPTION OF EMBODIMENTS

Figure 1:
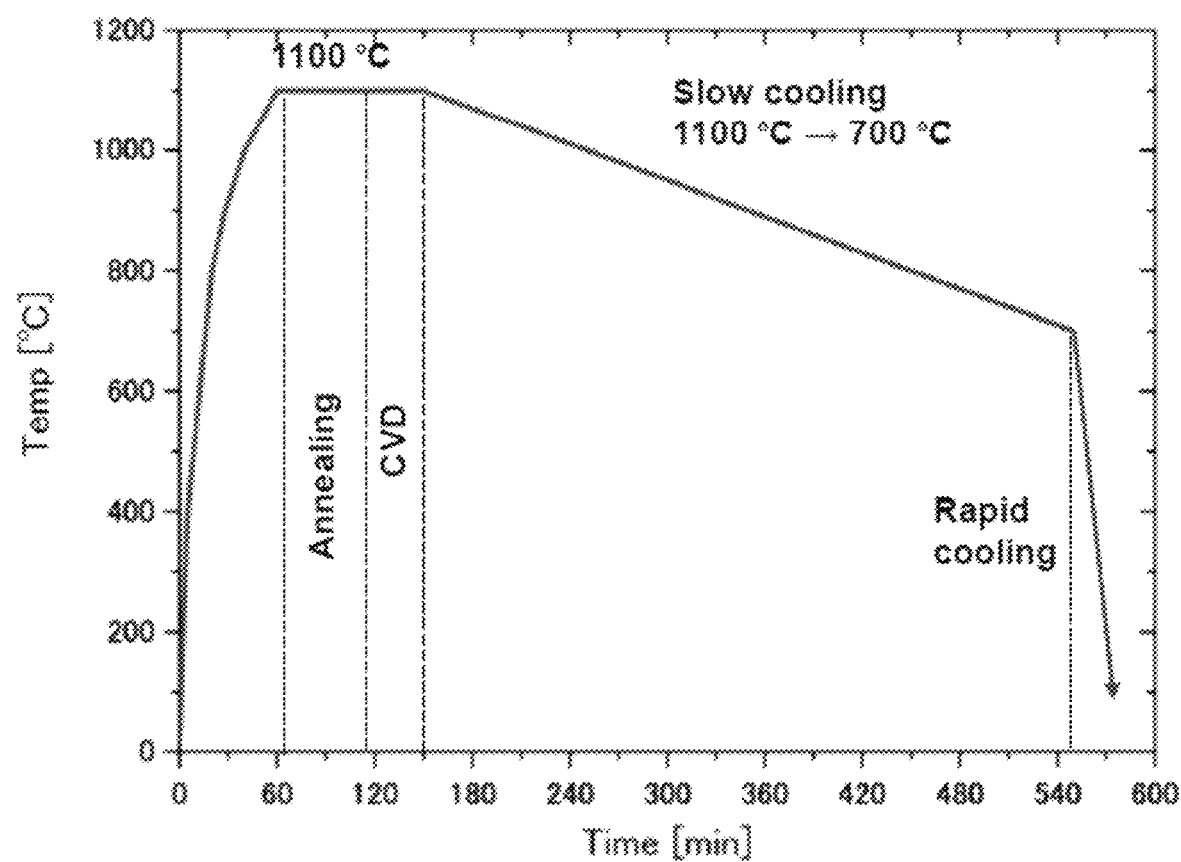
FIG. 1 shows a temperature profile of a CVD method used in the synthesis of a h-BN thin film shown in Examples.

Hereinafter, the embodiment of the present invention will be described in detail. Note that the specific embodiment is not limited to the following embodiments, and changes in design and the like without departing from the gist of the present invention are included in the present invention.

The crystal structure of the hexagonal boron nitride described above is similar to that of graphene in which boron and nitrogen atoms are replaced by carbon atoms, and therefore, conventionally, it has been proposed to apply the production method of a graphene film to the production of a hexagonal boron nitride film. For example, in Patent Literatures 1 and 2, it has been described that a h-BN film can be produced by a CVD method using, as a raw material gas, a gas of molecules containing boron and nitrogen atoms such as borazine in place of the hydrocarbon gas. However, in Patent Literature 1, it has been only specifically described that a single atomic film of graphene was prepared by using ethylene gas with a (111) plane of a single crystal Ni plate (substrate) as a template. Further, in Patent Literature 2, it has been only specifically described that a desired graphene film was obtained by bringing toluene gas into contact with a surface of the single crystal or polycrystalline Ni substrate polished under predetermined conditions and by performing carbon doping. In addition, in the method described in Patent Literature 3, an example (Example 4) in a case of forming a boron nitride layer between a substrate and a metal film has been described, however, it has not been described that the desired boron nitride layer was practically obtained. As described above, by simply taking the fact of having a similar crystal structure as the reason, it has not been necessarily clear whether the production method of a graphene film can be applied to the production of a hexagonal boron nitride film.

Unlike the case of the graphene constituted of single atoms (carbon atoms), hexagonal boron nitride is constituted of boron and nitrogen atoms arranged regularly, and therefore, the balance (atomic ratio) between the boron atoms and the nitrogen atoms becomes an important factor. In addition, it is considered that in a place where boron nitride is generated, that is, on a surface of a metal thin film, as the balance is closer to 1:1, the amount of generated boron nitride is more increased, and as a result, a hexagonal boron nitride film having a thicker thickness is obtained. Further, as a result of keen study that by controlling the balance between the boron atoms and the nitrogen atoms on a surface of a metal thin film, the amount of generated boron nitride is increased, and further, the crystallinity and uniformity of the film to be formed are improved, the present inventors have completed the present invention.

In an exemplary embodiment of the present invention, a film of boron nitride having a thickness of 1 nm or more is generated on a surface of a metal thin film by bringing a raw material gas containing boron atoms, nitrogen atoms, or both of boron atoms and nitrogen atoms into contact with the surface of the metal thin film.

In the present specification, the "metal thin film" contains at least one or more elements as the main component elements, and may contain impurities (inevitable impurities)

that are present in a raw material or inevitably mixed in a preparation process in a minute amount that does not influence on the characteristics of the metal thin film.

As the main component element of the metal thin film, a metal having some degree of at least one of boron solubility and nitrogen solubility is preferred. Examples of the main component element of the metal thin film include Fe, Ni, Co, Cu, and Cr, but are not limited thereto. In a preferred embodiment, the metal thin film contains at least one or more elements selected from the group consisting of Fe, Ni, Co, Cu, and Cr as the main component elements. In a more preferred embodiment, the metal thin film contains two or more elements as the main component elements. In a still more preferred embodiment, the metal thin film contains Ni and Fe, Co and Fe, or Cr and Fe as the main component elements.

The ratio of the main component elements in the metal thin film is not particularly limited, and may be appropriately adjusted depending on the boron solubility and the nitrogen solubility. Specifically, for example, in a case where the main component elements of a metal thin film are two elements (X and Y), by taking the solubility of boron and nitrogen in the element X and the solubility of boron and nitrogen in the element Y into consideration, the ratio (X:Y) of these elements may be adjusted. In this way, the solubility of boron and nitrogen when a raw material gas comes into contact with a surface of the metal thin film is appropriately controlled, and a hexagonal boron nitride thin film having a uniform thickness and high crystallinity can be formed. Further, by appropriately adjusting the ratio of the main component elements, the formation of impurities during the generation of boron nitride and during the generation of a hexagonal boron nitride thin film can be suppressed. For example, in a case where the main component elements of the metal thin film are Ni and Fe, the composition ratio of Ni and Fe can be in a range of 1:99 to 99:1, in a range of 5:95 to 95:5, in a range of 10:90 to 90:10, in a range of 20:80 to 80:20, in a range of 30:70 to 70:30, in a range of 40:60 to 60:40, or 50:50. In a preferred embodiment, the composition ratio of Ni and Fe can be set in a range of 10:90 to 99:1, and it is desirably considered that the composition ratio is adjusted so that the metal thin film contains 10% or more of Ni. With this adjustment, in a case where a hexagonal boron nitride thin film is produced by a chemical vapor deposition (CVD) method to be described later, the phase transition (transformation) of Fe from body-centered cubic structure (bcc structure) to face-centered cubic structure (fcc structure) is suppressed during the CVD reaction, and a hexagonal boron nitride thin film having higher quality and higher uniformity of the thickness can be obtained.

The metal thin film may be a stacked film of metal films of two or more components, or may also be a thin film of a metal alloy of two or more components. In this regard, in the present invention, the thin film of a metal alloy of two or more components may be a film formed on a predetermined substrate, or may also be a metal foil having no supporting substrate.

In a case where the metal thin film is a stacked film of metal films of two or more components, the ratio of the main component elements can be adjusted, for example, by adjusting the film thickness of each of the metal films. In the present invention, for example, in a case where the metal thin film is a film of 1 μm thickness in total in which metal films of two kinds of single components are stacked respectively by 0.5 μm thickness, the composition ratio of the main component elements is 50:50.

In a case where the metal thin film is a thin film of a metal alloy of two or more components, the metal alloy may be a binary alloy containing two elements as the main components, may be a ternary alloy containing three elements as the main components, or may be an alloy containing three or more elements as the main components. Examples of the binary alloy include Ni—Fe, Co—Fe, and Cr—Fe, but are not limited thereto. In this regard, in a case where the metal thin film is a thin film of a metal alloy of two or more components, the ratio of the main component elements in the metal thin film is assumed to be the same as the ratio in the metal alloy.

The surface of the metal thin film preferably has a specific surface orientation. Specifically, for example, the density or the like of the crystal structure formed by the main component elements contained in the metal thin film can be taken into consideration. That is, it is considered that even with the same metal kind, by using a crystal plane controlled in a larger area, the solubility of boron and nitrogen when a raw material gas comes into contact with a surface of the metal thin film is appropriately controlled, and a hexagonal boron nitride thin film having a uniform thickness and high crystallinity can be formed. For example, in a case where the metal thin film is a stacked film of metal films of Ni and Fe, or in a case where the metal thin film is a thin film of Ni—Fe of a binary alloy, the surface preferably has a (111) plane, a (100) plane, or a (110) plane of a face-centered cubic lattice. In addition, as suggested by the results of Examples to be described later, in a case where a hexagonal boron nitride thin film is prepared by a CVD method using a metal thin film containing two or more elements as the main component elements, the structural transformation of the main component element which gives a polycrystalline structure formed of small grains during the CVD reaction is suppressed, and it is desirably taken into consideration that relatively large crystal grains are present in the metal thin film after the CVD reaction. For example, in a case where the metal thin film is a stacked film of metal films of Ni and Fe, or in a case where the metal thin film is a thin film of Ni—Fe of a binary alloy, the metal thin film after the CVD reaction has a (111) plane, a (100) plane, or a (110) plane of a face-centered cubic lattice.

By bringing a raw material gas containing boron atoms, nitrogen atoms, or both of boron atoms and nitrogen atoms into contact with a surface of the metal thin film described above, the metal thin film acts as a catalyst, and boron nitride is generated. In this regard, in the present specification, the metal thin film is also referred to as "metal catalyst" corresponding to the context.

As the raw material gas, it is not particularly limited, and, for example, a gas containing both of boron atoms and nitrogen atoms can be used. In this case, it is preferably taken into consideration that the gas contains boron and nitrogen at a mole ratio of 1:1, but the mole ratio is not limited thereto. Specifically, for example, a vaporized gas of borazine ($B_3N_3H_6$), ammonia borane ($BH_3NH_3$), or 2,4,6-trichloroborazine ($B_3Cl_3H_3N_3$) can be mentioned.

Further, as the raw material gas, a gas containing boron atoms and a gas containing nitrogen atoms can also be used separately. For example, a boron gas and a gas of molecules containing nitrogen, a gas of molecules containing boron and a nitrogen gas, or a gas of molecules containing boron and a gas of molecules containing nitrogen can be used in combination. Examples of the molecule containing boron include diborane ($B_2H_6$), trichloroborane ($BCl_3$), and trifluoroborane ($BF_3$). Examples of the molecule containing nitrogen include ammonia ($NH_3$), and a nitrogen molecule ($N_2$).

In addition, as the raw material gas, one kind may be used alone, or two or more kinds may be used in combination. For example, as a raw material gas, a gas containing both of boron atoms and nitrogen atoms may be used singly alone, or two or more kinds of gases containing both of boron atoms and nitrogen atoms may be used in combination. Further, for example, as the raw material gas, a gas containing both of boron atoms and nitrogen atoms, and a gas containing boron atoms or nitrogen atoms may be used in combination. The selection and combination of as such raw material gases can be appropriately adjusted depending on the properties (for example, boron solubility, nitrogen solubility, and the like) of the metal catalyst to be used, the thickness of the hexagonal boron nitride thin film to be required, and the like.

As to the hexagonal boron nitride thin film to be prepared according to an exemplary embodiment of the present invention, a boron nitride thin film is formed, for example, by a chemical vapor deposition (CVD) method. Hereinafter, a method for producing the hexagonal boron nitride thin film according to the present invention by a CVD method will be described.

In a preferred embodiment, a metal thin film that serves as a catalyst for generating boron nitride is formed on a substrate (for example, single crystal substrate). Further, in another preferred embodiment, a single metal foil having no supporting substrate is used as a metal catalyst. In a case where a metal thin film is formed on a single crystal substrate, as the single crystal substrate, it is not particularly limited, and for example, a metal oxide single crystal of an alkaline earth metal, a transition metal, a rare earth metal, or the like can be used. Specifically, for example, MgO (magnesium oxide), $\alpha$-$Al_2O_3$ (sapphire), $MgAl_2O_4$ (spinel), $SiO_2$ (quartz crystal), $LaAlO_3$ (LAO), $TiO_2$ (titanium dioxide), mica (for example, $KMg_3AlSi_3O_{10}F_2$) and the like can be mentioned.

The size of the single crystal substrate is not particularly limited, and is for example, 1 to 1,000,000 $mm^2$ and preferably 100 to 20,000 $mm^2$ in consideration of obtaining a favorable hexagonal boron nitride thin film and of other conditions. In addition, the size of the metal foil is not particularly limited, and can be appropriately adjusted depending on the application and the like of the hexagonal boron nitride thin film.

When depositing a metal thin film on a surface of a single crystal substrate, for example, sputtering is performed on the single crystal substrate. The conditions, for example, the temperature of the substrate during the sputtering is appropriately adjusted depending on the kind of a metal to be used and the like. Further, as a film deposition method other than the sputtering, for example, deposition by resistive heating, an electron beam deposition, metal plating, or the like can be adopted.

In consideration of obtaining a favorable hexagonal boron nitride thin film and of other conditions, the film thickness of the metal thin film is preferably 0.005 to 1000 μm, and more preferably 0.1 to 100 μm.

In a preferred embodiment, the metal thin film contains at least one or more elements selected from the group consisting of Fe, Ni, Co, Cu, and Cr as the main component elements. In a more preferred embodiment, the metal thin film contains two or more elements as the main component elements.

The metal thin film may be a stacked film of metal films consisting of two or more components. In this case, the ratio of the main component elements of the metal thin film can be controlled, for example, by the film thickness of each of the elements. In the present invention, for example, in a case where a film of one metal (X) is stacked with a thickness of 300 nm and a film of the other metal (Y) is stacked with a thickness of 700 nm to obtain a stacked film with a thickness of 1 μm in total as the metal film of two kinds of single components, the composition ratio of the element X and the element Y in this metal thin film is X:Y=30:70.

Further, the metal thin film may be a thin film of a metal alloy with two or more components. For example, by using an alloy target having a determined composition of two or more components, a metal thin film having a predetermined composition ratio can be prepared. In this regard, in a case where the metal thin film is a thin film of a metal alloy of two or more components, the ratio of the main component elements is assumed to be the same as the ratio in the metal alloy.

Although the crystal structure of the surface of the metal thin film is not particularly limited, the solubility of boron and nitrogen in the main component elements contained in the metal thin film may be taken into consideration. As shown in Examples to be described later, in the production method according to the present invention, it is considered that the boron and nitrogen in a raw material gas come into contact with a surface of a metal thin film and are dissolved as a solid solution in the metal, and when the solid solution is precipitated during cooling, boron nitride is generated to form a thin film on the substrate. Therefore, when the crystal structure of the surface of the metal thin film has a specific surface orientation, boron and nitrogen are efficiently dissolved as a solid solution in a metal, and as a result, the amount of precipitation during cooling process is increased, and a hexagonal boron nitride thin film having a uniform thickness of 1 nm or more can be formed. In addition, it is understood that with regard to the solid solution amount of boron and nitrogen in the metal, the ratio of the main component elements, the size of the crystal grains of the metal, and the like can be the main factors.

A raw material gas is brought into contact with a surface of such a metal thin film to generate boron nitride, and a hexagonal boron nitride thin film is allowed to grow. It is preferred that the raw material gas is supplied at a constant pressure into a chamber in which a single crystal substrate with a metal thin film on the surface of the substrate, or a metal foil is arranged. Additionally, the raw material gas may be supplied into the chamber together with an inert gas such as helium or argon, or hydrogen gas.

The pressure of the raw material gas in a chamber is atmospheric pressure or reduced pressure, preferably $10^5$ to $10^{-5}$ Pa, and more preferably $10^5$ to $10^{-3}$ Pa. From the viewpoint of the forming speed of boron nitride or of obtaining a favorable hexagonal boron nitride thin film, the heat treatment temperature is preferably 300 to 1500° C., more preferably 400 to 1200° C., and still more preferably 500 to 1150° C. The heat treatment time is preferably 1 to 300 minutes, and more preferably 10 to 60 minutes.

As the means for the heat treatment, it is not particularly limited, and heating by, for example, heat radiation, induction heating, a laser, infrared rays, microwaves, plasma, UV rays, surface plasmon, or the like can be performed.

Further, by reducing a surface of a metal thin film as a catalyst by hydrogen annealing at a temperature lower than the CVD temperature before synthesizing boron nitride by a CVD method, the crystallinity of the surface of the metal thin film can be improved even at high temperature during the CVD synthesis. Specifically, the agglomeration of metal catalysts and the pit formation on a surface of a metal thin film are suppressed by performing hydrogen annealing at low temperature, and as a result, a hexagonal boron nitride thin film having a large area can be allowed to grow. It is also effective to perform hydrogen annealing at a CVD temperature after the hydrogen annealing at low temperatures.

A sample is arranged in a chamber for performing CVD, and the hydrogen annealing can be performed immediately before the CVD synthesis. The hydrogen annealing can be performed at a temperature of, for example, 400 to 600° C., or 1000 to 1200° C., and the longer the annealing time is, the better the crystallinity of the metal catalyst is, and further, the better the quality of the synthesized boron nitride is. In the supply of gas at the time of hydrogen annealing, the flow rate is set depending on the volume of a chamber, and for example, the supply can be performed by flowing hydrogen of 10 to 10000 sccm per liter of the chamber volume together with an inert gas.

A raw material gas is supplied for a certain period of time, and then the cooling is performed. At this time, boron and nitrogen dissolved as a solid solution in a metal catalyst are precipitated on a surface of the metal thin film to generate boron nitride, and a thin film of hexagonal boron nitride is formed on the surface of the metal thin film. The cooling rate is not particularly limited; however, it is considered that by performing the cooling at a slower rate, the boron and nitrogen are more uniformly precipitated to generate boron nitride, and the uniformity of the hexagonal boron nitride thin film to be formed is further improved. Specifically, for example, the cooling can be performed at a cooling rate of 0.01 to 50° C./min, preferably 0.1 to 10° C./min, more preferably 0.1 to 5.0° C./min, and still more preferably 0.1 to 1.0° C./min. Further, as the cooling rate, a constant rate may be used, or multiple cooling rate conditions may be used in combination. For example, after the CVD synthesis, the cooling rate may be 0.1 to 1.0° C./min from the CVD synthesis temperature to the middle of the cooling process (for example, until reaching 700° C.), and then may be adjusted to an arbitrary cooling rate selected from the cooling rate conditions described above. In addition, the cooling is performed while flowing, for example, hydrogen gas.

In this regard, at the time of supplying a raw material gas onto a surface of a metal thin film and/or at the time of the cooling, part or all of the above-described inert gas or hydrogen gas may be replaced with a raw material gas (second raw material gas) containing boron atoms or nitrogen atoms. In this way, with regard to the solid solution amount of boron and nitrogen in the above-described metal, the smaller amount of boron atoms or nitrogen atoms in a metal film is compensated by the second raw material gas, and the generation of boron nitride can be performed more efficiently. That is, the amount of boron and nitrogen in a metal catalyst is assumed to be different depending on the metal kind to be used, and therefore, by supplying a gas containing boron atoms or nitrogen atoms as a second raw material gas in addition to adjusting the kind, the supply amount and the like of the raw material gas, the boron atom or nitrogen atom being deficient is compensated when boron and nitrogen dissolved as a solid solution in a metal catalyst are precipitated during cooling, and by bring the balance of boron atoms and nitrogen atoms on a surface of the metal thin film closer to 1:1, the amount of generated boron nitride is further increased, and a hexagonal boron nitride thin film having a constant thickness of 1 nm or more can be formed.

In the production method according to the present invention, by correlating the above-described various production conditions with each other, a hexagonal boron nitride thin film having a uniform thickness and high crystallinity can be obtained. That is, in a case where boron nitride is generated by a CVD method as described above, by correlating a factor of a metal kind, a crystal plane, a crystal grain size, or the like regarding a metal catalyst, a factor of a kind of gas, a composition, or the like regarding a raw material gas, and a factor of a gas supply (including a gas supply as a second raw material gas), a temperature profile, or the like regarding CVD with each other, a hexagonal boron nitride thin film having a large area, a uniform thickness of 1 nm or more, and few grain boundaries can be obtained.

The hexagonal boron nitride thin film according to the present invention, which is prepared by the production method as described above, is a hexagonal boron nitride thin film having a large area, a uniform thickness, and high crystallinity. By making such a hexagonal boron nitride thin film into a stacked body containing the hexagonal boron nitride thin film, the hexagonal boron nitride thin film can be applied to a thin film transistor using the stacked body, an electronic device provided with the thin film transistor, or the like.

For example, according to the CVD method described above, a hexagonal boron nitride thin film having a large area is formed on a metal thin film formed on a single crystal substrate being relatively inexpensive and having a large area, such as magnesium oxide (MgO), sapphire ($\alpha$-$Al_2O_3$), spinel ($MgAl_2O_4$), quartz crystal ($SiO_2$) or mica. Further, by using the CVD method described above, a hexagonal boron nitride thin film having a large area can be formed on a single metal foil.

In addition, the hexagonal boron nitride thin film according to the present invention is a boron nitride thin film having a thickness of 1 nm or more, that is, formed of three or more atomic layers. For example, according to the CVD method described above, a hexagonal boron nitride thin film having a thickness of 1 nm or more and 50 nm or less can be obtained. The thickness of the hexagonal boron nitride thin film can be estimated, for example, by using a flake of hexagonal boron nitride exfoliated from a single crystal. Specifically, for example, the height of a flake of the hexagonal boron nitride that has been exfoliated from a single crystal or obtained from a metal catalyst and transferred onto a silicon substrate (for example, Si substrate with $SiO_2$ of 300 nm) having an oxide film is measured with an atomic force microscope, and the optical contrast is measured with an optical microscope, and thus the thickness of the hexagonal boron nitride thin film can be estimated. In addition, by analyzing the cross section of the prepared thin film with an atomic force microscope or a transmission electron microscope, the thickness of the hexagonal boron nitride thin film can be estimated.

Further, the hexagonal boron nitride thin film according to the present invention is excellent in the uniformity of the thickness. In this regard, the uniformity of a hexagonal boron nitride thin film can be confirmed, for example, by measuring a value of each component of RGB from a microscope image (RGB image) obtained when a flake of hexagonal boron nitride that has been exfoliated from a single crystal or obtained from a metal catalyst and transferred onto a silicon substrate (for example, Si substrate with $SiO_2$ of 300 nm) having an oxide film is observed at a predetermined magnification with an optical microscope, and by evaluating and analyzing the distribution of the extracted G component. More specifically, in a preferred embodiment, the hexagonal boron nitride thin film according to the present invention has a coefficient of variation of an intensity distribution of a G component of an RGB image obtained with an optical microscope of 5% or less on a silicon substrate having an oxide film. In a more preferred embodiment, in the hexagonal boron nitride thin film according to the present invention, the intensity distribution of a G component of the RGB image obtained with an optical microscope is unimodal on a silicon substrate having an oxide film.

With regard to the intensity distribution of a G component of the RGB image, the expression "coefficient of variation" means the degree of dispersion of the values. The intensity of the G component (and the average thereof) varies depending on the preparation method, the observation conditions, and the like of the observation sample, and therefore, in the present invention, the coefficient of variation obtained by dividing the standard deviation by the average is used as an index. The smaller the value of the coefficient of variation is, the closer the intensity distribution of a G component is to a single color, and which means that the hexagonal boron nitride thin film has a more uniform layer structure.

The expression "unimodal" means that the hexagonal boron nitride thin film covers the silicon substrate in the field of view. In a case where the exposure of the silicon substrate is confirmed within the field of view, a peak due to the oxide on a surface of the silicon substrate is obtained, and therefore, the intensity distribution of the G component becomes "bimodal". Further, in a case where the layer structure (the number of layers) of the hexagonal boron nitride thin film is nonuniform, the intensity distribution of a G component is widely dispersed and becomes "multimodal". It should be noted that even in a case where the intensity distribution of a G component is bimodal, a peak due to the silicon oxide film on a surface of the silicon substrate may be generated depending on the accuracy of the transfer technique, or the like, and therefore, it can be understood that the peak does not directly indicate the quality of the hexagonal boron nitride thin film itself, and the hexagonal boron nitride thin film is excellent in the uniformity of the layer structure (the number of layers) as long as a sharp peak due to the hexagonal boron nitride can be obtained.

Further, the hexagonal boron nitride thin film according to the present invention has high crystallinity. In this regard, the crystallinity of a hexagonal boron nitride thin film can be confirmed, for example, by performing Raman spectrum measurement and measuring the position and the full width at half maximum of the $E_{2g}$ peak derived from the hexagonal boron nitride. Specifically, for example, from the microscope image obtained when the hexagonal boron nitride thin film is observed at a predetermined magnification with an optical microscope, multiple (for example, at least 50 or more) measurement positions are selected, and by measuring and comparing the position and the full width at half maximum of the $E_{2g}$ peak from the Raman spectrum obtained at each of the measurement positions, and by evaluating and analyzing the uniformity of the peak intensity, the uniformity of the crystals in the hexagonal boron nitride thin film can be confirmed. More specifically, in a preferred embodiment, the hexagonal boron nitride thin film according to the present invention has an average value of the full width at half maximum (FWHM) of the $E_{2g}$ peak obtained from Raman spectrum of 20 cm$^{-1}$ or less. In a more preferred embodiment, the hexagonal boron nitride thin film according to the present invention has an average value of the full width at half maximum (FWHM) of the $E_{2g}$ peak obtained from Raman spectrum of 9 to 20 cm$^{-1}$.

EXAMPLES

Hereinafter, the present invention is further specifically described by way of Examples, however, the present invention is not limited to these Examples at all.

Example 1

An MgO substrate having a (100) plane was used as a single crystal substrate. This substrate was mounted in a chamber of an RF magnetron sputtering system, and a Fe metal or a Ni metal, or both of the Fe metal and the Ni metal were deposited on a surface of the substrate by sputtering in a state of heating the substrate to make a film (under an Ar atmosphere, and a pressure of 0.6 Pa as a standard condition).

In this way, a Fe film, a Ni film, or a Fe—Ni laminated film, which had a film thickness of 1 μm, was deposited on a substrate. In a case of a Fe—Ni laminated film, the total film thickness was set to 1 μm, and the ratio of Fe to Ni was controlled by the film thickness. The film was formed at a substrate temperature of 500 to 400° C. when Fe was used, and 600 to 500° C. when Ni was used. The substrate temperature can be room temperature (around 25° C.) or any other temperature in both cases where Fe is used and where Ni is used. Hereinafter, the substrates on which these metal catalysts were deposited are referred to as Fe/MgO (100), Ni/MgO (100), and stacked Fe—Ni/MgO (100), respectively.

After depositing a metal catalyst film by sputtering, the substrate was cut into pieces of an appropriate size, for example, a 5 mm square or a 10 mm square, if necessary, and the h-BN thin film was synthesized by a CVD method in the following procedures.

Using a horizontal tubular furnace, a single crystal substrate on which a film of a catalyst metal had been formed was arranged on the central part of a quartz tube installed in the tubular furnace by using a quartz boat.

As the substrate, Fe/MgO (100), Ni/MgO (100), or stacked Fe—Ni/MgO (100) prepared as described was used. As the stacked Fe—Ni/MgO (100), two kinds of substrates of (1) Fe$_{0.7}$—Ni$_{0.3}$/MgO (100) (Ni=30%) (a Fe film of 700 nm, and a Ni film of 300 nm), and (2) Fe$_{0.3}$—Ni$_{0.7}$/MgO (100) (Ni=70%) (a Ni film of 700 nm, and a Fe film of 300 nm) were used. Further, for comparison, a Fe foil (having a thickness of 20 manufactured by Nilaco Corporation) was also used. The CVD synthesis was performed by using the temperature profile shown in FIG. 1.

The substrate was set inside the tubular furnace, and then the entire quartz tube was evacuated by a rotary pump. After that, hydrogen gas was flowed at 10 sccm to reach 40 to 50 Pa. While flowing the same amount of hydrogen gas, the temperature was raised to 1100° C. over 60 minutes, and the temperature of 1100° C. was retained for 60 minutes, as shown in FIG. 1. In this way, the crystallinity of the metal catalyst that had been film formed by sputtering was increased, and further the smoothness of the surface was improved. In addition, a natural oxide film on a surface of the metal can be removed by hydrogen gas.

As a raw material for the boron and the nitrogen, borazine (B$_3$N$_3$H$_6$) was used. Liquid borazine was placed in a bottle with hydrogen of 0.12 to 0.13 MPa while cooling at −10° C. A hydrogen gas at 0.27 sccm containing a borazine vaporized gas from the bottle was mixed with a hydrogen gas at 10 sccm of the main line, and the mixture was introduced into the tubular furnace. This reaction was performed for 30 minutes.

After that, while blocking the hydrogen gas containing a borazine vaporized gas and flowing only the hydrogen gas at 10 sccm of the main line, the cooling rate was controlled at 1° C./min, and the cooling was performed until the temperature reached 700° C. After the temperature reached 700° C., the tubular furnace was turned off and cooled to room temperature.

After completion of the CVD reaction, the substrate was taken out. In order to conduct a detailed evaluation of the generated h-BN, the h-BN formed on a metal film was transferred onto a $SiO_2$/Si substrate. By transferring the h-BN onto a $SiO_2$/Si substrate, the amount and the thickness distribution of the generated h-BN can be easily analyzed with an optical microscope. Further, the Raman peak obtained from the h-BN becomes strong after the transfer, and more accurate evaluation can be conducted.

The transfer was typically performed by the following method. A polymethyl methacrylate (PMMA) solution was spin coated on a surface of the metal thin film after synthesis for protecting the h-BN, and the spin-coated PMMA film was baked at 115° C. for 20 minutes. A thermal release tape (Revalpha manufactured by Nitto Denko Corporation) was deposited on the PMMA. A substrate was immersed into a mixed solution of a $FeCl_3$ aqueous solution and hydrochloric acid, a catalyst was sufficiently etched and the h-BN was floated to a surface of the solution together with the thermal tape and the PMMA, and then the floated one was picked up with a pair of tweezers. The $FeCl_3$ and the hydrochloric acid were carefully washed away from the picked-up one by using ion exchanged water, and then placed on a $SiO_2$/Si substrate (having a thickness of $SiO_2$ of 300 nm) and dried at 60 to 100° C. After that, the heating was performed until the temperature reached 120° C., the adhesiveness of the thermal release tape was eliminated, the thermal release tape was removed from the PMMA film, and the PMMA film was removed in weakly heated acetone.

The h-BN after transfer onto a $SiO_2$/Si substrate was analyzed with an optical microscope. As the optical microscope, ECLIPSE ME600 manufactured by Nikon Corporation, and as the CCD camera, DS-Fi1 manufactured by Nikon Corporation was used. Optical micrographs are shown in FIGS. 2(a)-2(e) and 3(a)-3(e). In this regard, FIGS. 2(a)-2(e) show images at high magnification, and FIGS. 3(a)-3(e) show images at low magnification.

Figure 2:
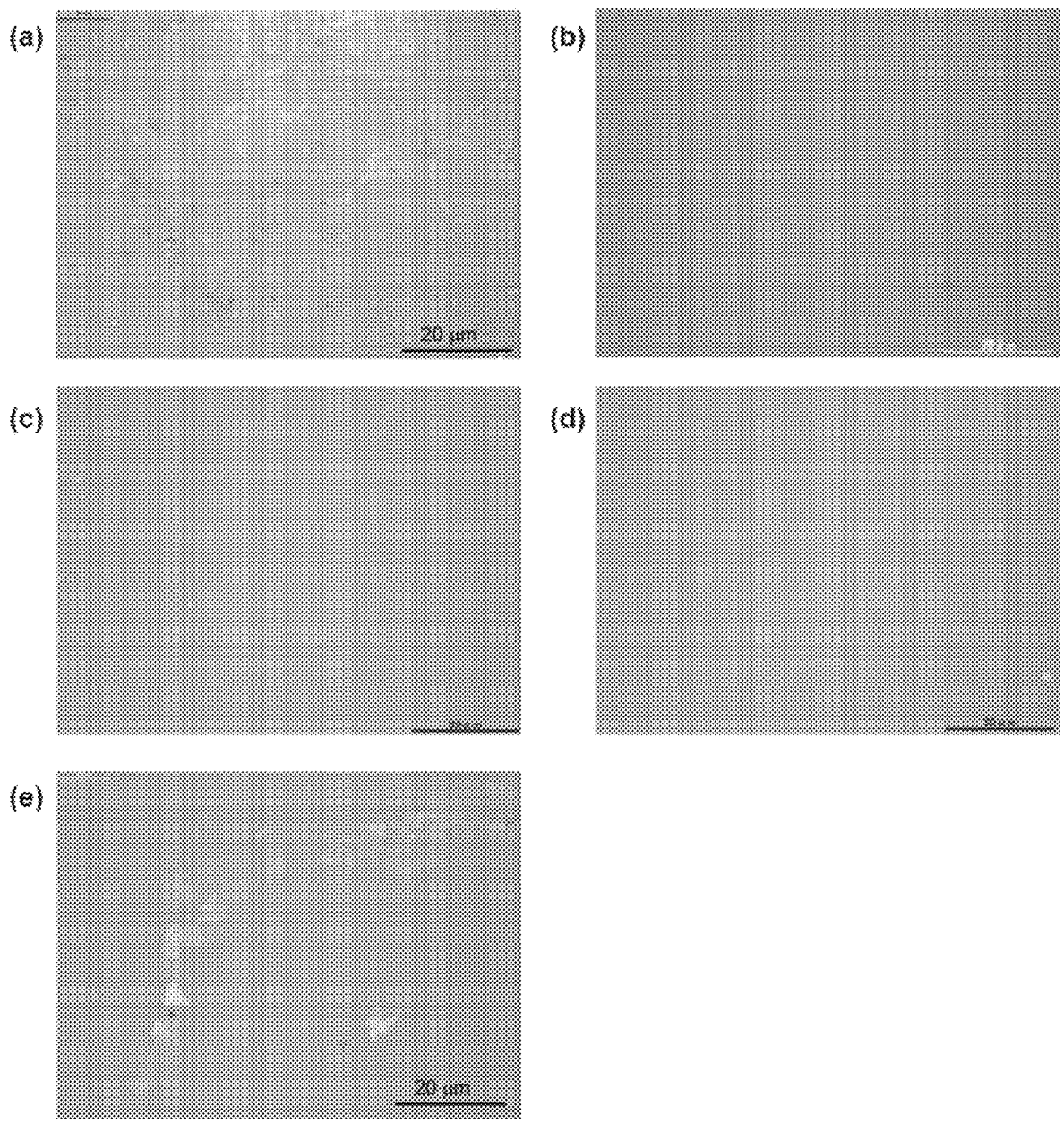
FIGS. 2(a)-2(e) show optical microscope images of the h-BN synthesized using different metal catalysts and transferred onto SiO$_2$/Si substrates (at high magnification).
Figure 3:
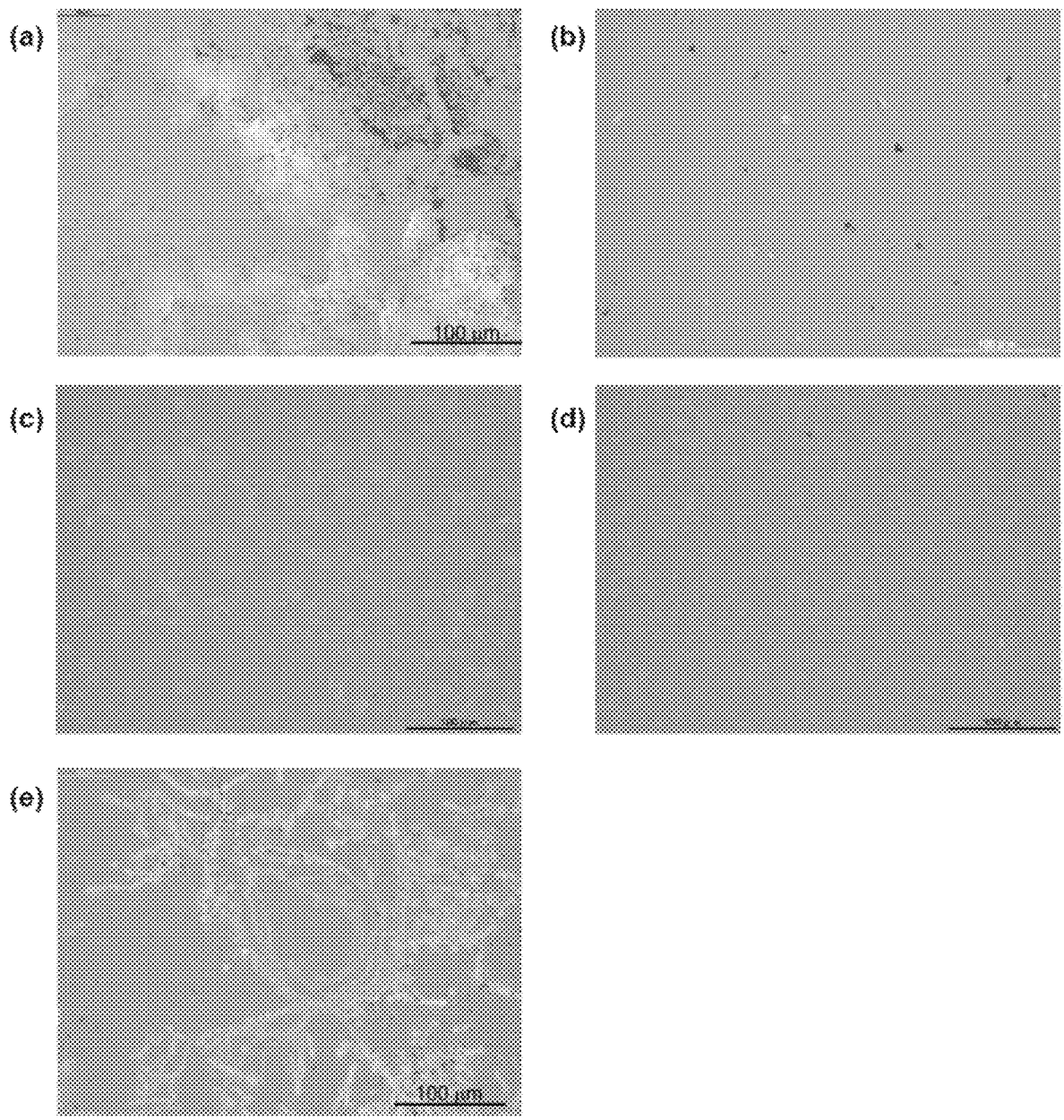
FIGS. 3(a)-3(e) show optical microscope images of the h-BN synthesized using different metal catalysts and transferred onto SiO$_2$/Si substrates (at low magnification).

In a case where Fe/MgO (100) was used as a catalyst (FIG. 2(a)), a h-BN film having a thick thickness was generated. However, it was found that the optical contrast was highly variable, and the thickness was extremely non-uniform. In addition, in FIG. 3(a), a large number of black particles were observed. In contrast, in a case where Ni/MgO (100) was used (FIG. 2(b)), extremely small h-BN was only partially generated. Further, as the optical contrast was weak, it was found that the thickness of the h-BN was thin. In addition, in a case where a stacked film of Fe and Ni was used as a catalyst, the optical contrast became uniform. In a case where the Fe was 70% (FIG. 2(c)), the uniformity of the thickness of the h-BN was improved as compared with that of the Fe alone (FIG. 2(a)). However, an area having a thick thickness was observed in some parts. In a case where the Ni was 70% (FIG. 2(d)), a substantially uniform optical contrast was obtained, and it was indicated that the generated h-BN is extremely uniformly. In addition, the amount of generated h-BN was reduced due to the function of Ni. In a case of a Fe foil (FIG. 2(e)), the h-BN having a large thickness was locally generated, and the h-BN of one to two layers having a thin thickness covered almost the entire surface of the Fe foil.

The thickness of the h-BN shown in FIG. 2(d) was estimated by using a h-BN flake exfoliated from a single crystal. The height of the exfoliated h-BN flake was determined by an atomic force microscope (Nanoscope V manufactured by Bruker Corporation), and the optical contrast was measured by an optical microscope. As a result, the thickness of the h-BN shown in FIG. 2(d) was estimated to be approximately 3 to 10 nm.

Figure 4A:
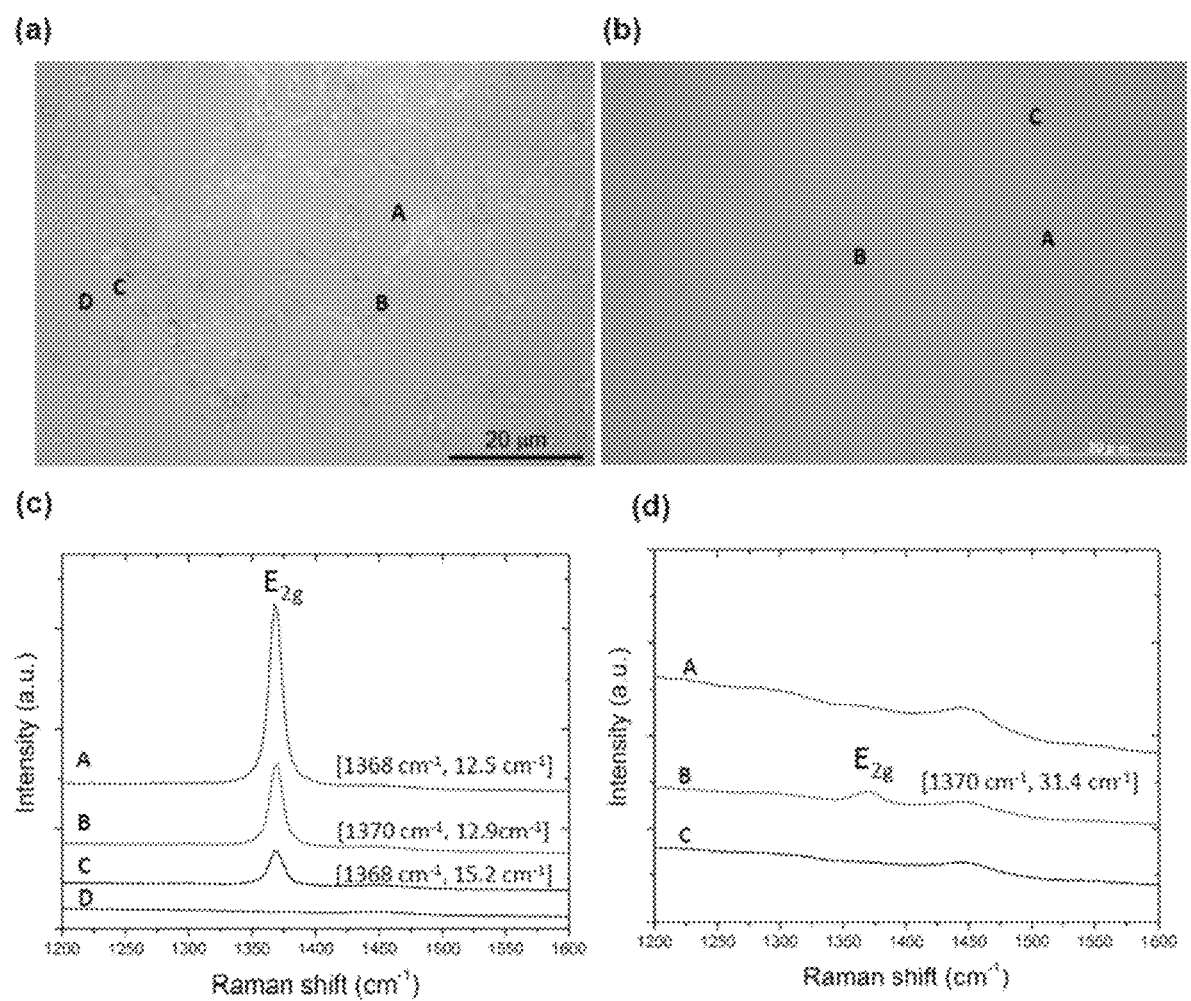
FIGS. 4A(a)-4A(d) show optical microscope images (FIGS. 4A(a) and 4A(b)) and Raman spectra (FIGS. 4A(c) and 4A(d)) of the h-BN transferred onto SiO$_2$/Si substrates.
Figure 4B:
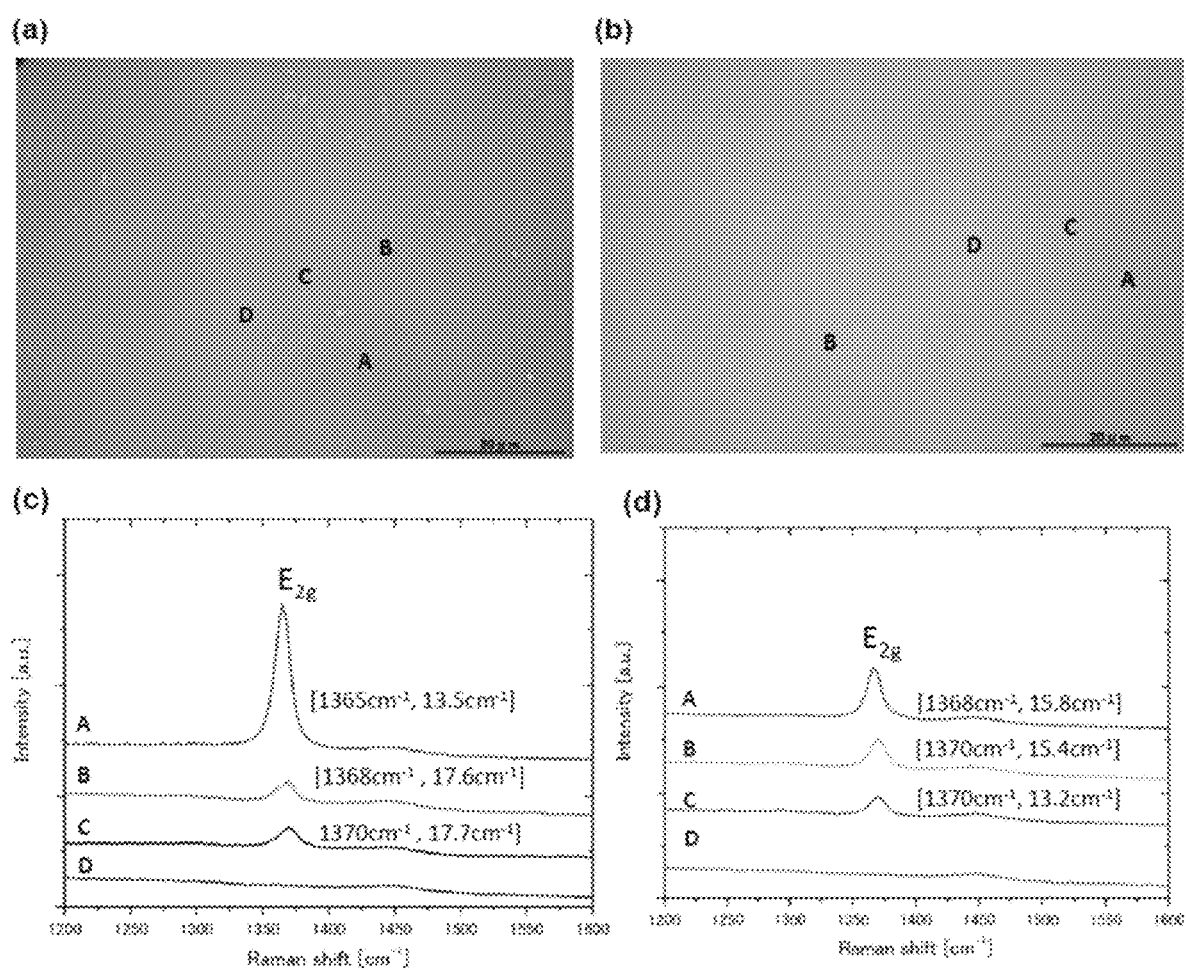
FIGS. 4B(a)-4B(d) show optical microscope images and the Raman spectra of the h-BN transferred onto SiO$_2$/Si substrates.
Figure 4C:
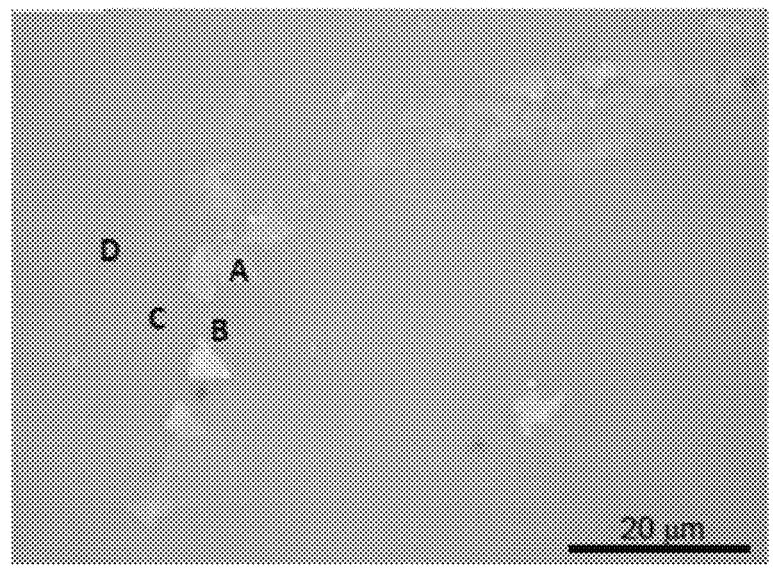
FIGS. 4C(a) and 4C(b) show an optical microscope image and measurement results of the Raman spectra of the h-BN transferred from a Fe foil onto a SiO$_2$/Si substrate. The wave numbers in the Raman spectrum represent the position and the full width at half maximum of the E$_{2g}$ peak derived from the h-BN.
Figure 4C:
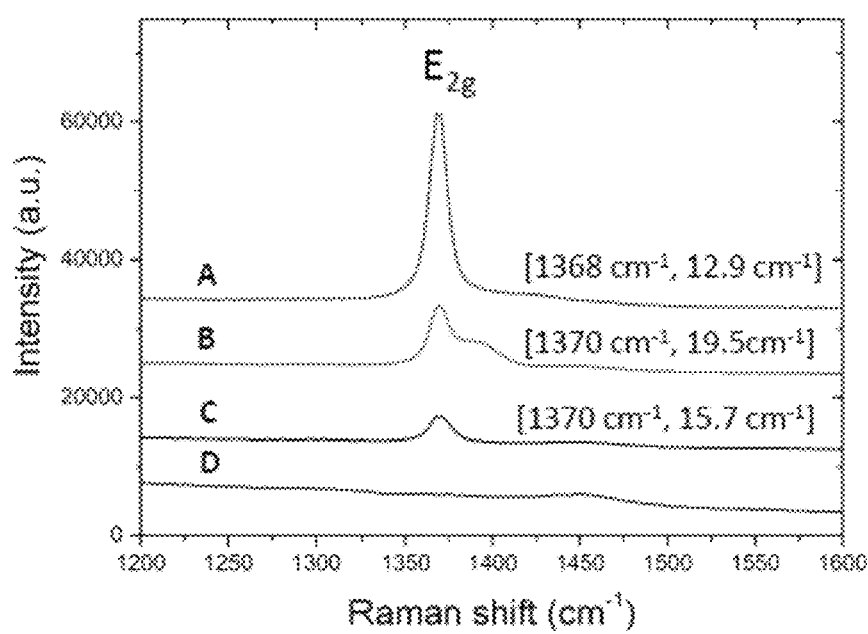

FIGS. 4A(a)-4A(d), 4B(a)-4B(d), 4C(a) and 4C(b) show optical microscope images and measurement results of the Raman spectrum of the h-BN transferred onto $SiO_2$/Si substrates. In the measurement of the Raman spectrum, Nanofinder 30 manufactured by Tokyo Instruments, Inc. was used, and the excitation wavelength was set to 532 nm, and the spot size was set to around 0.6 μm. FIGS. 4A(a)-4A(d) shows optical microscope images and Raman spectra of the h-BNs obtained with Fe/MgO (100) and Ni/MgO (100). FIGS. 4B(a)-4B(d) show optical microscope images and Raman spectra of the h-BNs obtained with $Fe_{0.7}$—$Ni_{0.3}$/MgO (100) (Ni=30%) and $Fe_{0.3}$—$Ni_{0.7}$/MgO (100) (Ni=70%). FIGS. 4C(a) and 4C(b) show an optical microscope image and Raman spectra of the h-BN transferred from a Fe foil onto a $SiO_2$/Si substrate. In the optical microscope images of FIGS. 4A(a)-4A(d), 4B(a)-4B(d), 4C(a) and 4C(b), the positions at which the Raman spectrum was measured are shown. Further, in the Raman spectra, the position and the full width at half maximum (FWHM) of $E_{2g}$ peak were described.

As shown in FIGS. 4A(a) and 4A(c), in a sample of Fe/MgO (100), the $E_{2g}$ peaks derived from the h-BN were confirmed at 1368 to 1370 $cm^{-1}$, and it can be understood that the crystallinity was favorable from the values of the FWHM, however, there was no uniformity in the peak intensity at the measured positions A to C. Further, as shown in FIGS. 4A(b) and 4A(d), in a sample of Ni/MgO (100), the $E_{2g}$ peak was only observed with an extremely weak intensity in the measured position B, and it can be understood that the crystallinity was poor because the FWHM was as wide as 31.4 $cm^{-1}$. In contrast, in FIGS. 4B(a)-4B(d), in both of the samples of $Fe_{0.7}$—$Ni_{0.3}$/MgO (100) (Ni=30%) and $Fe_{0.3}$—$Ni_{0.7}$/MgO (100) (Ni=70%), the $E_{2g}$ peaks derived from the h-BN were clearly observed at 1365 to 1370 $cm^{-1}$, and therefore, it was confirmed that the formed film is h-BN. Further, as shown in FIGS. 4B(a) and 4B(c), in a case of the $Fe_{0.7}$—$Ni_{0.3}$/MgO (100) (Ni=30%), the peak intensity was uniform at the measured positions B and C, but in contrast, as shown in FIGS. 4B(b) and 4B(d), in a case of the $Fe_{0.3}$—$Ni_{0.7}$/MgO (100) (Ni=70%), more uniform peak intensity was obtained at the measured positions A to C. Accordingly, it was indicated that the latter h-BN film is more excellent in terms of the uniformity. In addition, the FWHM values of the $E_{2g}$ peak in FIGS. 4B(c) and 4B(d) were in a range of 13 to 20 $cm^{-1}$, which reflect that the crystallinity is high. In a sample of a Fe foil shown in FIGS. 4C(a) and 4C(b), the $E_{2g}$ peaks derived from the h-BN were confirmed, however, the uniformity of the peak intensity was not observed at the measured positions A to C, and it can be understood from the values of the FWHM of the $E_{2g}$ peaks that the crystallinity varies depending on the position.

Figure 5:
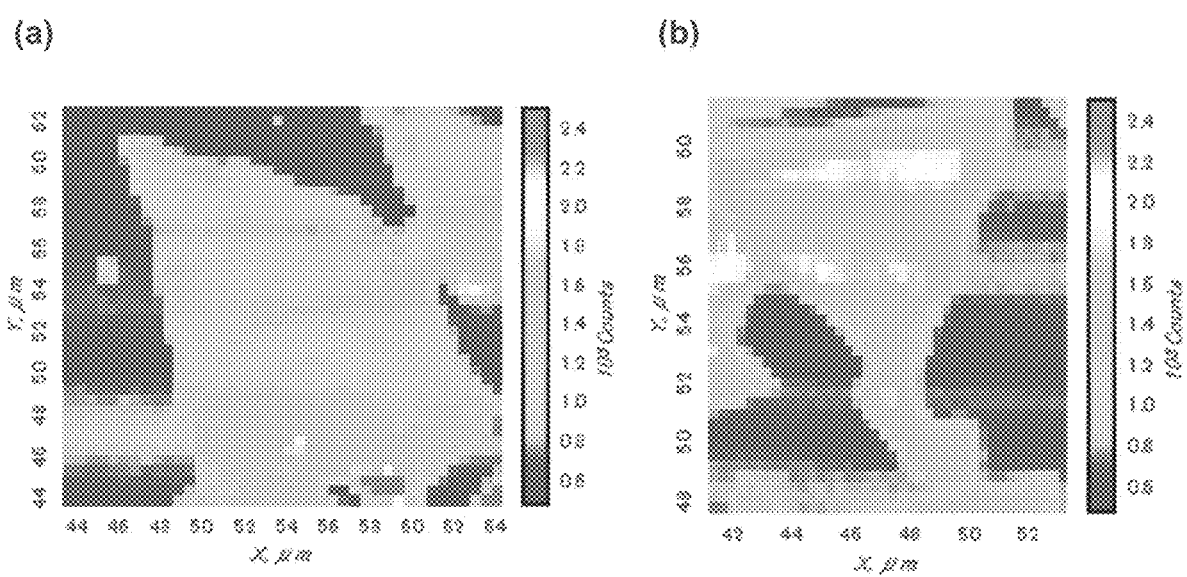
FIGS. 5(a) and 5(b) show results of Raman mapping measurements performed to the h-BN obtained with Fe$_{0.7}$—Ni$_{0.3}$/MgO (100) (Ni=30%) and Fe$_{0.3}$—Ni$_{0.7}$/MgO (100) (Ni=70%). The intensity of the E$_{2g}$ peak derived from the h-BN, which is located at 1365 to 1370 cm$^{-1}$, is shown.

In order to further examine the spatial uniformity, Raman mapping to the $E_{2g}$ peak intensity was performed by using Nanofinder 30. FIGS. 5(a) and 5(b) each show the results of Raman mapping measurements performed to the h-BNs obtained with $Fe_{0.7}$—$Ni_{0.3}$/MgO (100) (Ni=30%) and $Fe_{0.3}$—$Ni_{0.7}$/MgO (100) (Ni=70%). In both cases, the $E_{2g}$ peak intensity are uniform inside the grain. In particular, it was confirmed also from the Raman mapping that the latter was excellent in terms of the uniformity.

Figure 6:
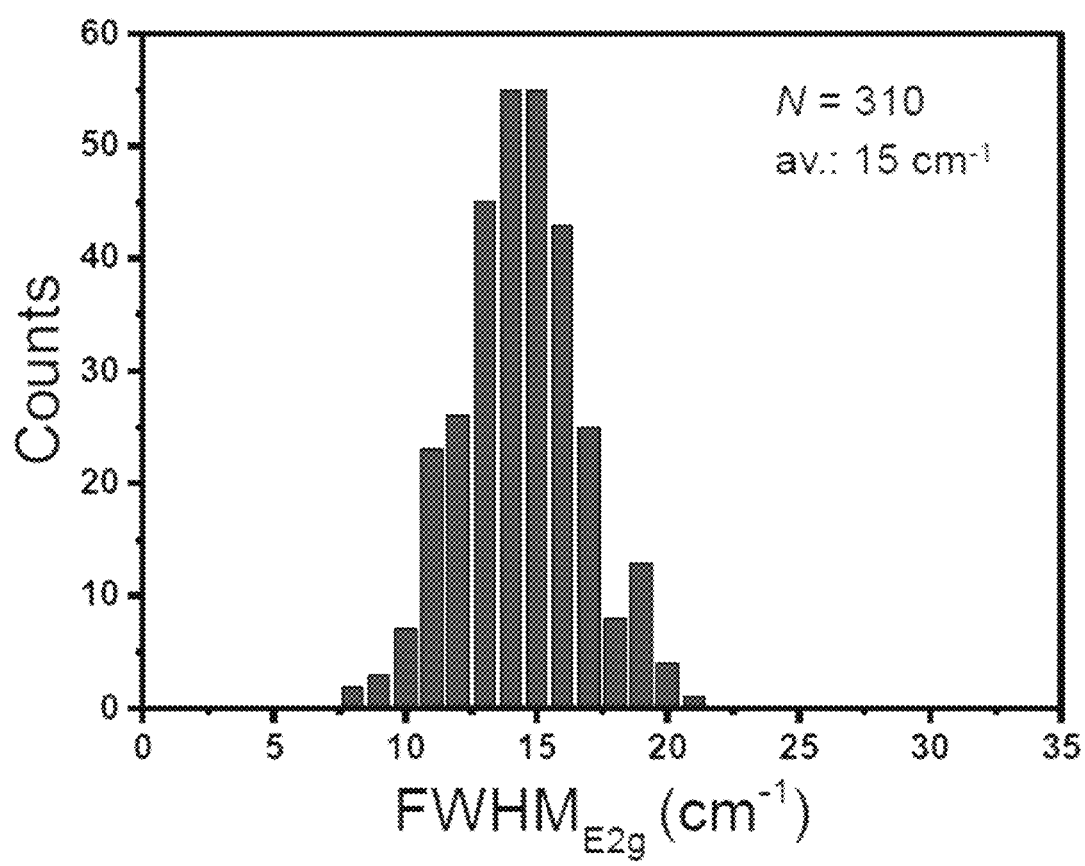
FIG. 6 shows measurement results of Raman spectrum of the h-BN transferred from Fe$_{0.3}$—Ni$_{0.7}$/MgO (100) (Ni=70%) onto a SiO$_2$/Si substrate.

Further, for the $Fe_{0.3}$—$Ni_{0.7}$/MgO (100) (Ni=70%), 310 places were randomly selected from a 20 μm square area of the h-BN transferred onto a $SiO_2$/Si substrate, and the intensity and the full width at half maximum (FWHM) of the $E_{2g}$ peak derived from the h-BN were measured. As shown in FIG. 6, because the average value of the FWHM of the $E_{2g}$ peak was 15 cm$^{-1}$, it was confirmed that the h-BN has high crystallinity.

Figure 7:
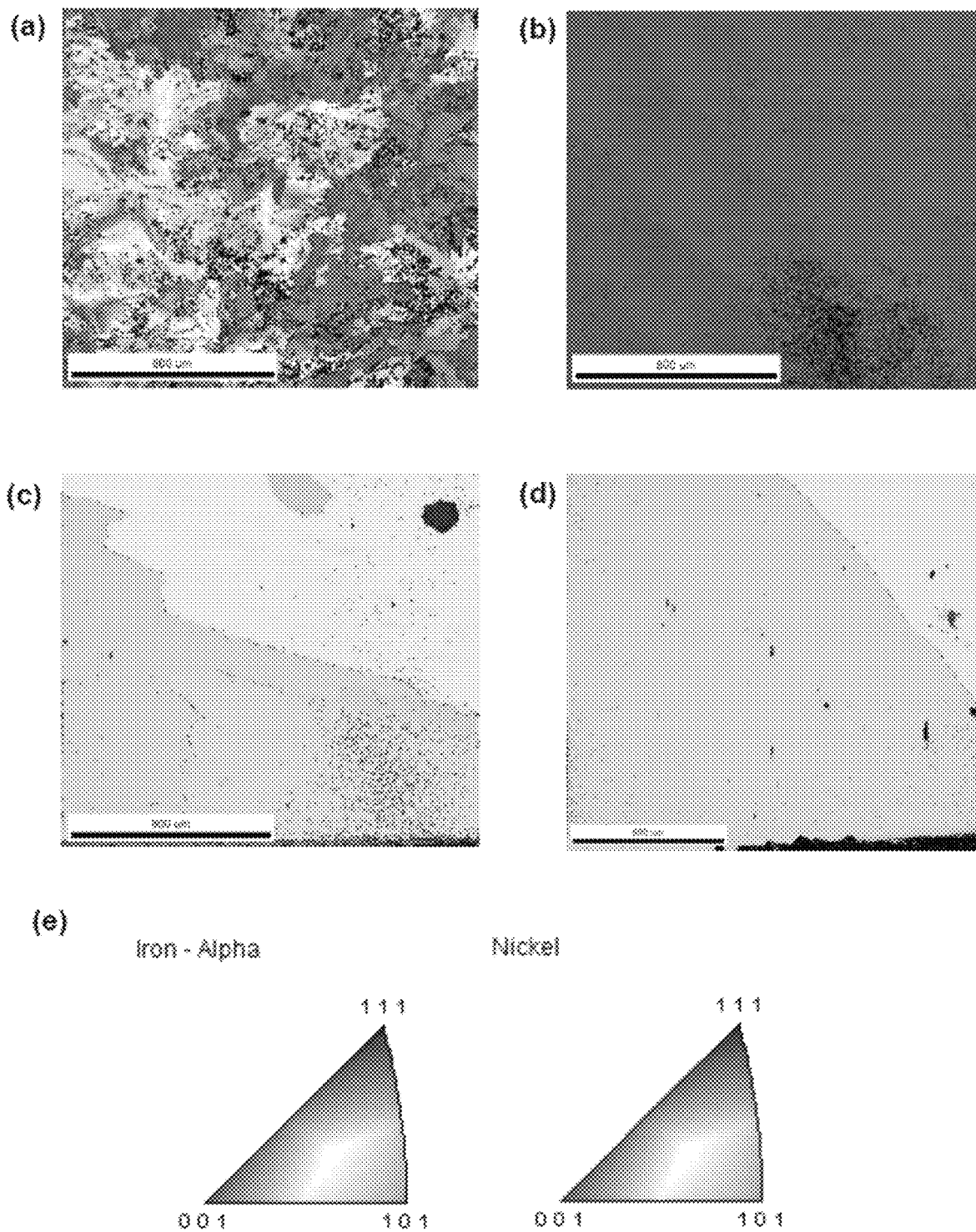
FIGS. 7(a)-7(e) show electron back scatter diffraction (EBSD) images of a metal thin film after CVD.
Figure 8:
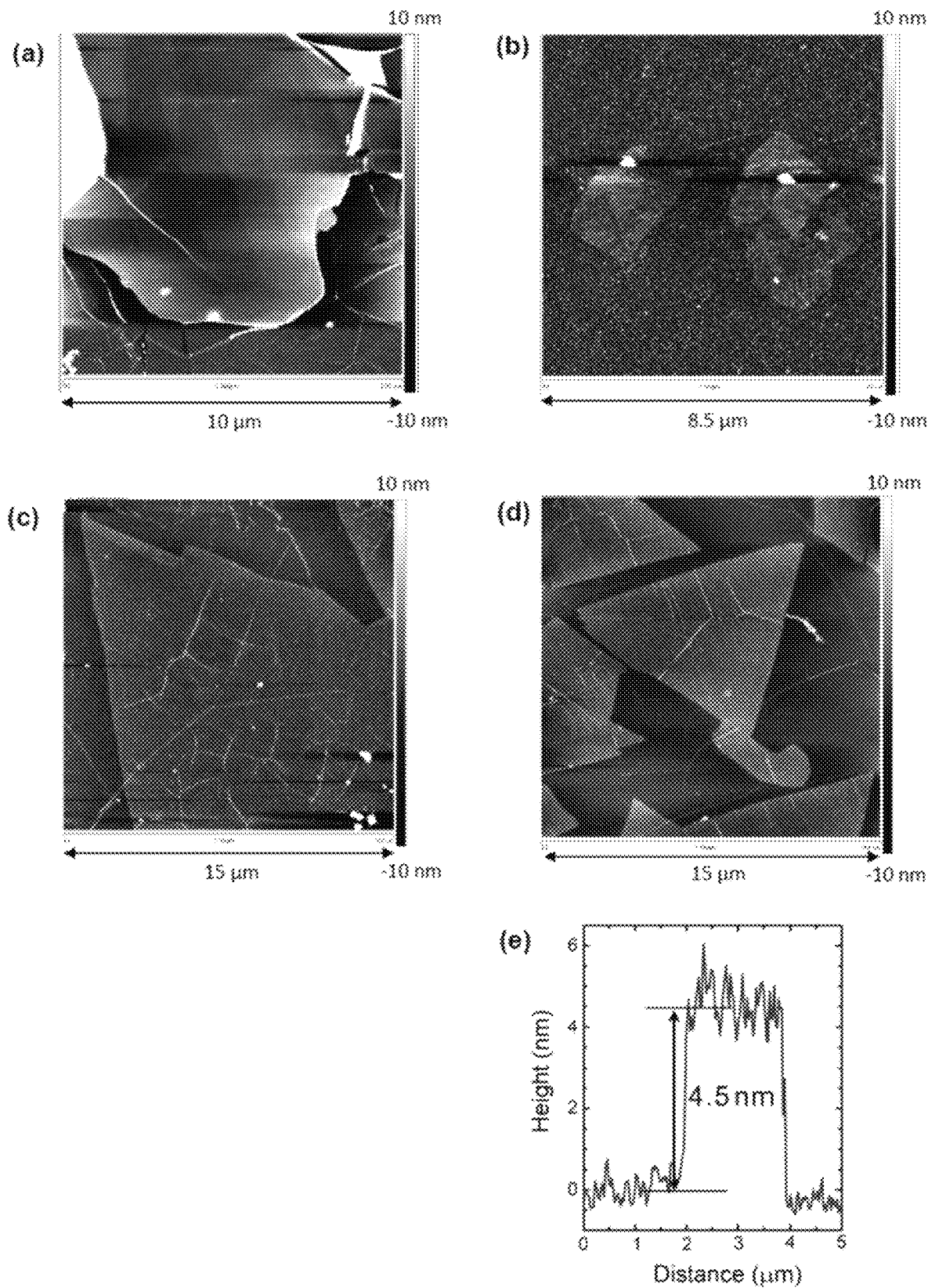
FIGS. 8(a)-8(e) show atomic force microscope images of the h-BN synthesized using different metal catalysts.

Next, in order to examine the effect of the crystallinity and crystal orientation of the metal catalyst, EBSD (electron back scatter diffraction) of each of Fe/MgO (100), Ni/MgO (100), $Fe_{0.7}$—$Ni_{0.3}$/MgO (100) (Ni=30%), and $Fe_{0.3}$—$Ni_{0.7}$/MgO (100) (Ni=70%) was measured after CVD. The Fe thin film of a Fe/MgO (100) substrate shown in FIG. 7(a) was made of small grains with various orientations. It is known that when Fe is heated, the phase transition (transformation) from a body-centered cubic structure (bcc structure, a iron) to a face-centered cubic structure (fcc structure, y iron) occurs at 910° C. During the CVD reaction, the Fe on MgO (100) also transforms from bcc to fcc, reacts with borazine in the fcc structure, and changes to bcc again during cooling, and therefore, it is considered that the Fe films showed polycrystalline structure with small grains. In contrast, the Ni metal of Ni/MgO (100) (FIG. 7(b)) exhibits a uniform fcc (100) plane. This indicates that the Ni had a stable fcc structure from room temperature to high temperature, and a Ni (100) thin film epitaxially deposited on MgO (100) was also retained during CVD at high temperature. Unlike the above case, in a case of the $Fe_{0.7}$—$Ni_{0.3}$/MgO (100) (Ni=30%) and the $Fe_{0.3}$—$Ni_{0.7}$/MgO (100) (Ni=70%), a crystal plane corresponding to the fcc (110) plane was obtained (FIGS. 7(c) and 7(d)). In particular, in a case of the $Fe_{0.3}$—$Ni_{0.7}$/MgO (100) (Ni=70%), an EBSD image having uniform contrast was obtained due to the strong influence of high-concentration Ni metal. That is, it is suggested that the transformation of Fe was suppressed by the presence of a certain amount of Ni. It can be considered that the h-BN thin film was uniformly precipitated and grew on a surface of a metal due to the presence of large crystal grains as shown in FIG. 7(d).

FIGS. 8(a)-8(e) show the results of observation of a surface of the transferred film of h-BN with an atomic force microscope (AFM). The h-BN generated on Fe/MgO (100) was relatively smooth, but at the edge of the h-BN, the upward warping of thin film grains was prominent (FIG. 8(a)). Almost no generation of h-BN occurred on Ni/MgO (100), and some flakes were observed in a small part (FIG. 8(b)). The h-BN transferred from $Fe_{0.7}$—$Ni_{0.3}$/MgO (100) (Ni=30%) had smooth surface, but multiple particles were also present (FIG. 8(c)). In contrast, in the h-BN transferred from $Fe_{0.3}$—$Ni_{0.7}$/MgO (100) (Ni=70%), almost no particles were observed, and it was found that the surface smoothness is high (FIG. 8(d)). The thickness of the grain of this h-BN was estimated to be around 4.5 nm from the analysis of the height profile obtained with an atomic force microscope (FIG. 8(e)). Further, in FIG. 8(d), it can also be understood that the adjacent grains are considerably close to each other in the height.

Figure 9:
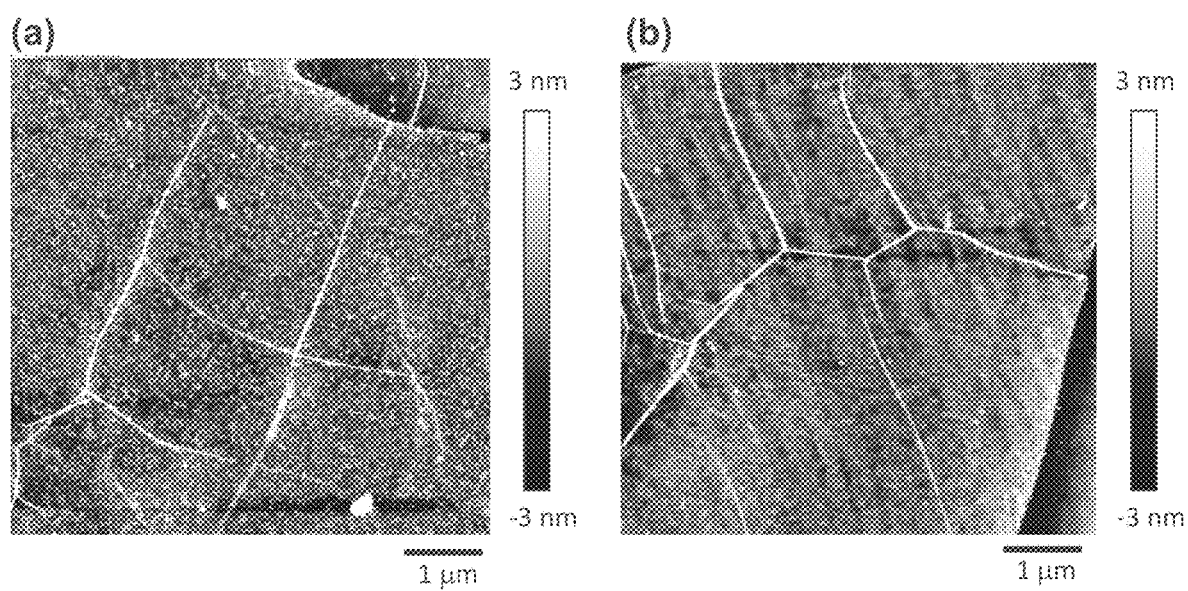
FIG. 9(a) shows an enlarged image of an atomic force microscope image of FIG. 8(c), Fe$_{0.7}$—Ni$_{0.3}$/MgO (100) (Ni=30%).
FIG. 9(b) shows an enlarged image of an atomic force microscope image of FIG. 8(d), Fe$_{0.3}$—Ni$_{0.7}$/MgO (100) (Ni=70%).

FIGS. 9(a) and 9(b) show magnified images of atomic force microscope images of $Fe_{0.7}$—$Ni_{0.3}$/MgO (100) (Ni=30%) and $Fe_{0.3}$—$Ni_{0.7}$/MgO (100) (Ni=70%). In both of the images, wrinkles were observed. The wrinkles were formed due to the difference between the thermal expansion coefficients of the metal thin film and the h-BN, or might have been introduced during transfer. Similar wrinkles were often observed before the transfer, and therefore, it is highly possible that wrinkles were generated mainly during the CVD.

Example 2-1

Films of a Fe metal and a Ni metal were formed on a surface of a substrate by sputtering to prepare $Fe_{0.3}$—$Ni_{0.7}$/spinel (100) (Ni=70%) (a Ni film of 700 nm, and a Fe film of 300 nm) in a similar procedure as in Example 1 except that a spinel substrate having a (100) plane was used as the single crystal substrate.

A h-BN thin film was synthesized by a CVD method under similar conditions as in Example 1 except that the $Fe_{0.3}$—$Ni_{0.7}$/spinel (100) (Ni=70%) substrate was used, and nitrogen gas was mixed at 25% with the hydrogen gas to be used in supplying a borazine vaporized gas as a raw material and in performing the cooling, and the generated h-BN was transferred onto a $SiO_2$/Si substrate in a similar manner as in Example 1.

Figure 10:
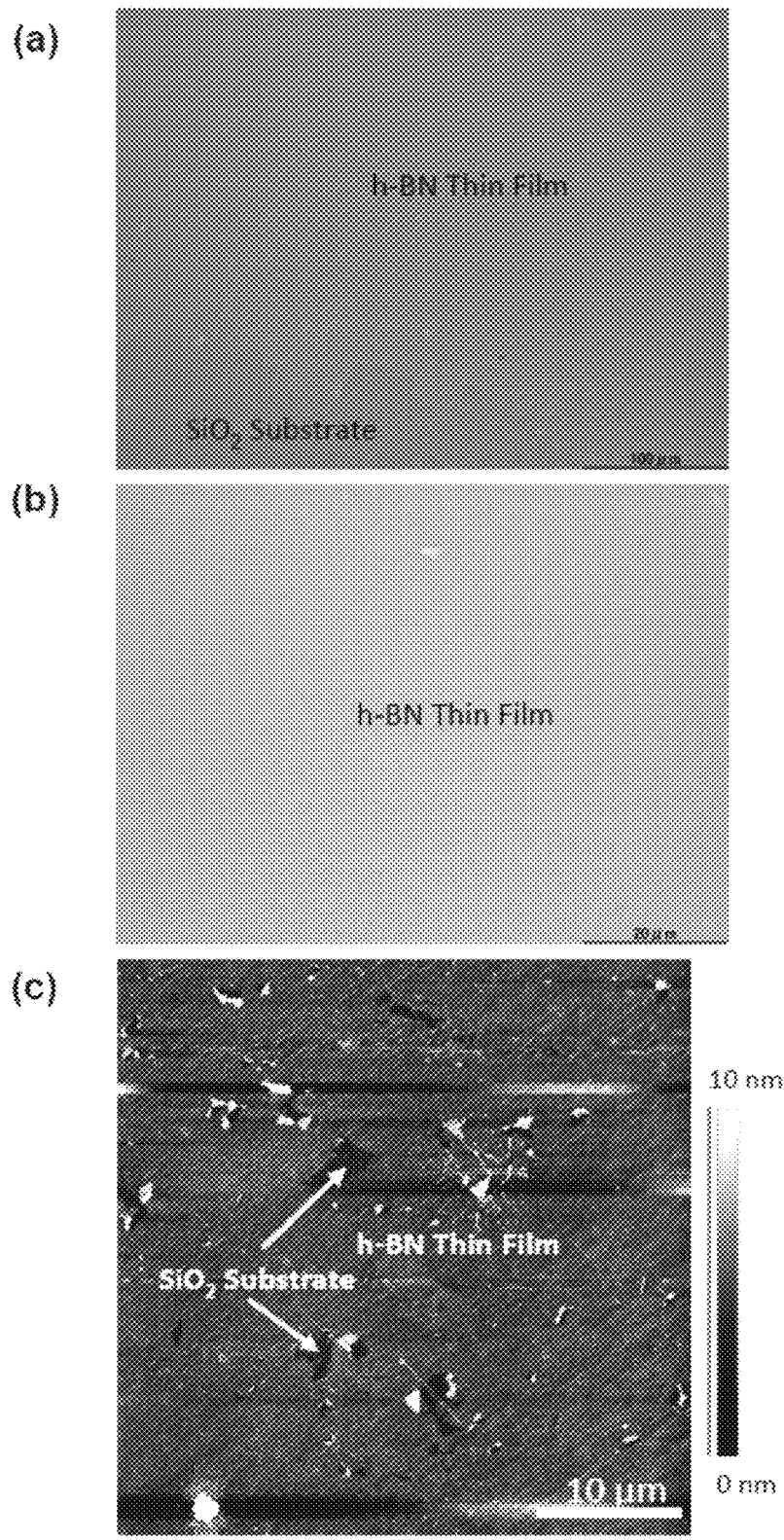
FIGS. 10(a)-10(c) show optical microscope images and an atomic force microscope image of the h-BN synthesized with Fe$_{0.3}$—Ni$_{0.7}$/spinel (100) (Ni=70%).

The h-BN after transfer onto a $SiO_2$/Si substrate was analyzed with an optical microscope and an atomic force microscope (AFM). FIGS. 10(a) to 10(c) show optical microscope images (at low magnification and at high magnification) and an atomic force microscope image, of the synthesized h-BN, respectively. From these microscope images, it was confirmed that an extremely uniform h-BN thin film having a thickness of around 3 nm was obtained.

Figure 11:
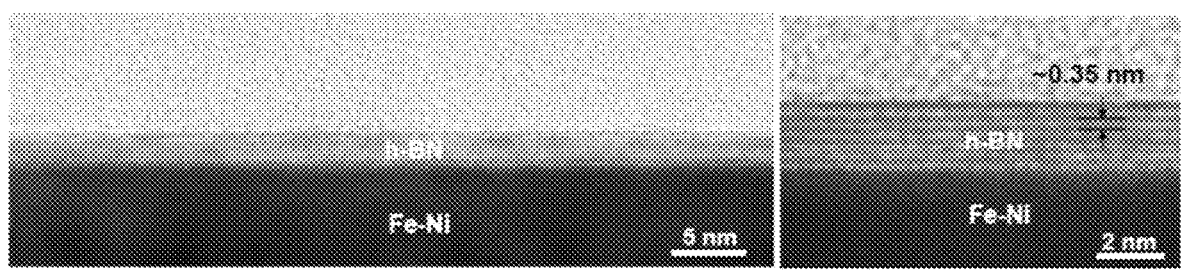
FIG. 11 shows transmission electron microscope images in a cross-section direction of the h-BN synthesized with Fe$_{0.3}$—Ni$_{0.7}$/spinel (100) (Ni=70%). The scale bar of the image on the left side is 5 nm, and the scale bar of the image on the right side is 2 nm.

Further, the results obtained by the analysis with a transmission electron microscope on the cross section of the h-BN thin film on the $Fe_{0.3}$—$Ni_{0.7}$/spinel (100) (Ni=70%) substrate after CVD are shown in FIG. 11.

From the microscope images shown in FIG. 11, it was confirmed that an extremely uniform h-BN thin film that has a thickness of around 3 nm consisting of around seven h-BN layers with an interlayer distance of around 0.35 nm was formed.

Figure 12:
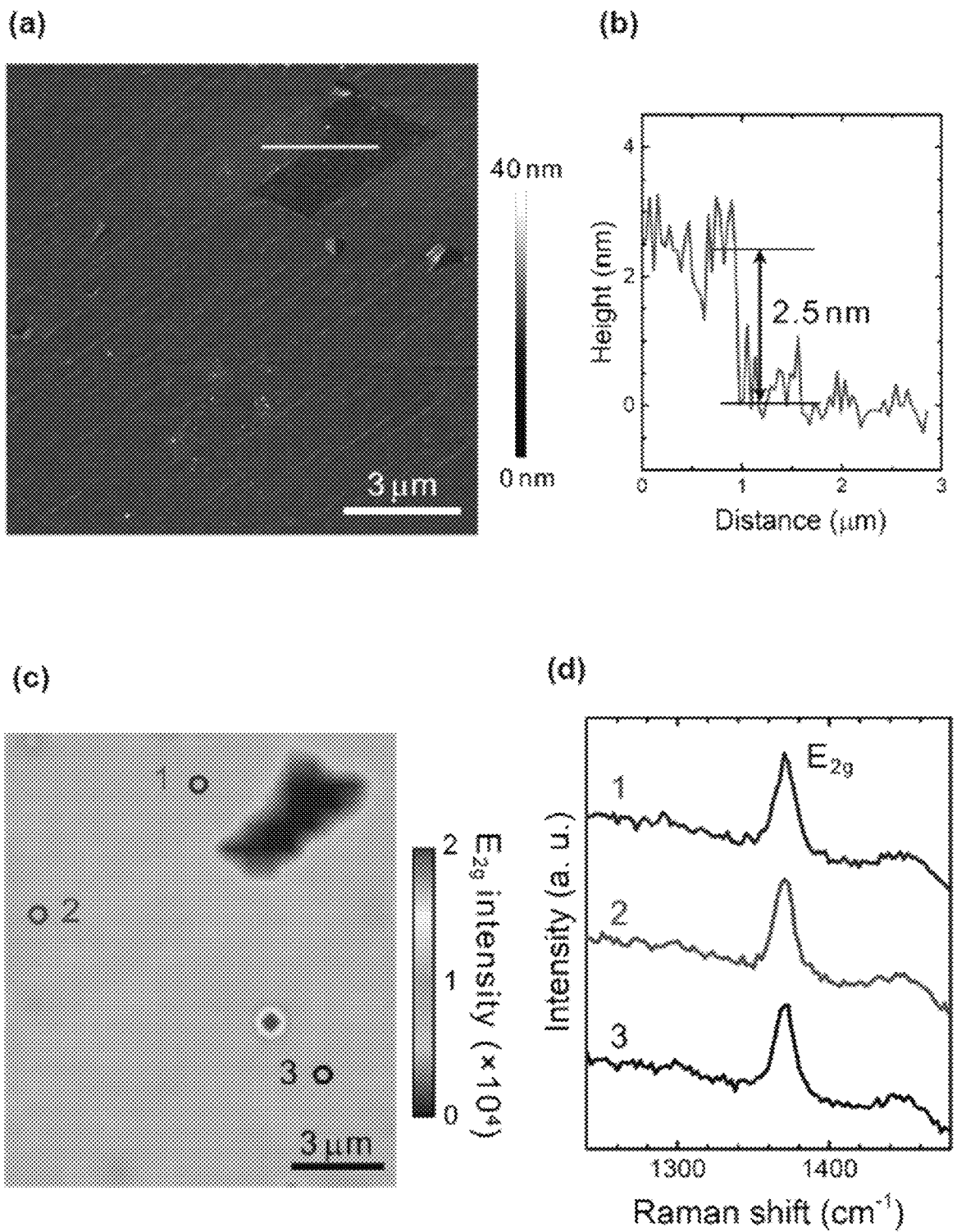
FIG. 12(a) shows an atomic force microscope image of the h-BN transferred from Fe$^{0.3}$—Ni$_{0.7}$/spinel (100) (Ni=70%) onto a SiO$_2$/Si substrate.
FIG. 12(b) is a height profile of the h-BN determined with an atomic force microscope.
FIG. 12(c) is intensity mapping of the E$_{2g}$ peak of the Raman spectrum in the same area as that of FIG. 12(a).
FIG. 12(d) shows Raman spectra at the positions with the numbers described in FIG. 12(c).

FIGS. 12(a)-12(d) show atomic force microscope images and measurement results of the Raman spectrum of the h-BN transferred onto a $SiO_2$/Si substrate. FIGS. 12(a) and 12(b) show an atomic force microscope image of the h-BN transferred from $Fe_{0.3}$—$Ni_{0.7}$/spinel (100) (Ni=70%) onto a $SiO_2$/Si substrate, and a height profile of the h-BN determined with an atomic force microscope, respectively. FIG. 12(c) shows intensity mapping of the $E_{2g}$ peak of the Raman spectrum in the same area as that of FIG. 12(a), and FIG. 12(d) shows Raman spectra at the positions with the numbers described in FIG. 12(c).

From the atomic force microscope image shown in FIG. 12(a), it can be confirmed that this multi-layered h-BN had an extremely uniform film thickness. Further, from FIG. 12(b), the thickness of this h-BN was around 2.5 nm. In addition, also from the Raman mapping image of FIG. 12(c), and FIG. 12(d), it is indicated that the h-BN that had uniform intensity of the $E_{2g}$ peaks, indicating that h-BN the high uniformity of the layer numbers was grown and transferred.

Figure 13:
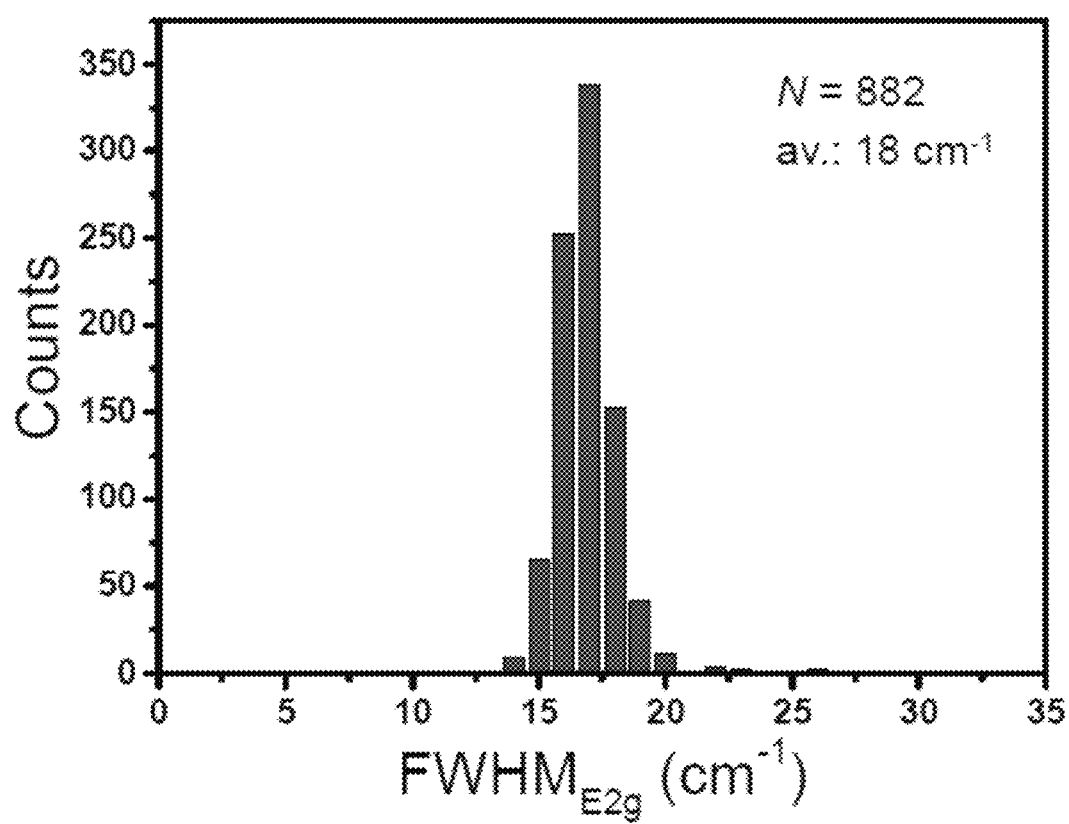
FIG. 13 shows measurement results of Raman spectrum of the h-BN transferred from Fe$_{0.3}$—Ni$_{0.7}$/spinel (100) (Ni=70%) onto a SiO$_2$/Si substrate.

Moreover, 882 places were randomly selected from a 20 μm square area of the h-BN transferred from $Fe_{0.3}$—$Ni_{0.7}$/spinel (100) (Ni=70%) onto a $SiO_2$/Si substrate, and the intensity and the full width at half maximum (FWHM) of the $E_{2g}$ peak derived from the h-BN were measured. As shown in FIG. 13, the average value of the FWHM of the $E_{2g}$ peak was 18 cm$^{-1}$, and it was confirmed that the h-BN have high crystallinity.

Figure 14:
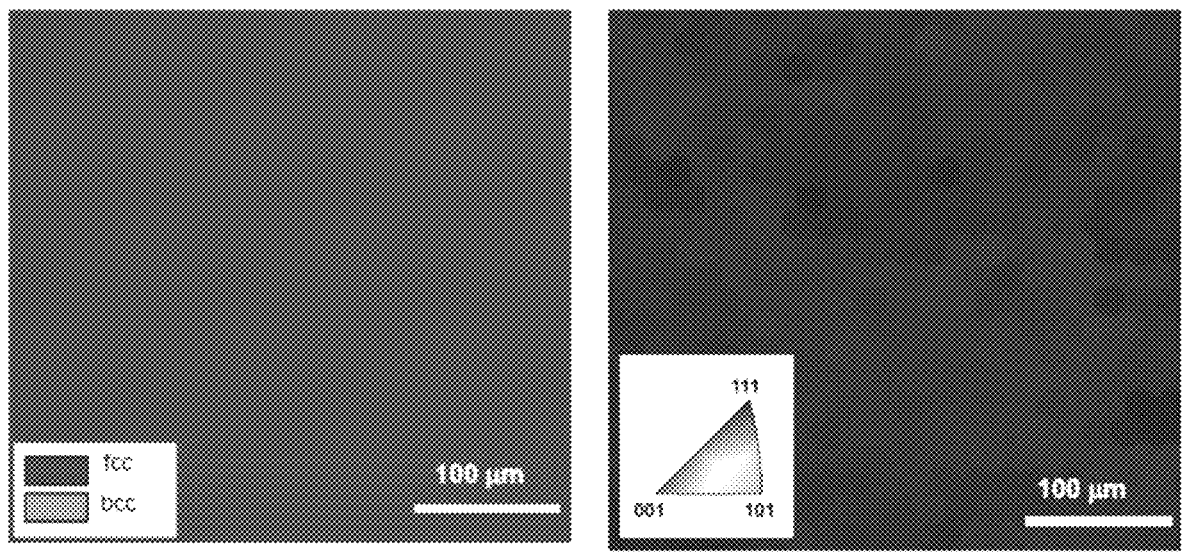
FIG. 14 shows EBSD images of the Fe$_{0.3}$—Ni$_{0.7}$/spinel (100) (Ni=70%) after CVD. The left shows a phase distribution map, and the right shows a crystal orientation map.

FIG. 14 shows EBSD measurement results of $Fe_{0.3}$—$Ni_{0.7}$/spinel (100) (Ni=70%) after CVD. As shown in FIG.

14, in a case of the $Fe_{0.3}$—$Ni_{0.7}$/spinel (100) (Ni=70%), a uniform crystal plane corresponding to a fcc (111) plane was obtained.

Reference Example 1

A film of a Ni metal was formed on a surface of a substrate by sputtering to prepare Ni/spinel (100) in a similar procedure as in Example 1 except that a spinel substrate having a (100) plane was used as the single crystal substrate.

A h-BN thin film was synthesized by a CVD method under similar conditions as in Example 1 except that the Ni/spinel (100) substrate was used, and nitrogen gas was mixed at 50% with the hydrogen gas to be used in supplying a borazine vaporized gas as a raw material and in performing the cooling, and the generated h-BN was transferred onto a $SiO_2$/Si substrate in a similar manner as in Example 1.

As a result of analyzing the h-BN after transfer onto a $SiO_2$/Si substrate with an optical microscope, it was confirmed that a thick h-BN film was formed, however, an area having a nonuniform thickness was observed in some parts. Further, from the measurement results of the Raman spectrum, the full width at half maximum of the $E_{2g}$ peak derived from the h-BN was in a range of 15 to 20 $cm^{-1}$, and it was confirmed that the crystallinity is high. In the present invention, these results are considered to suggest that in the generation of boron nitride by a CVD method, as described above, by correlating a factor regarding a metal catalyst, a factor regarding a raw material gas, and a factor regarding CVD condition, the desired hexagonal boron nitride thin film was obtained.

Example 2-2

Films of a Fe metal and a Ni metal were formed on a surface of a substrate by sputtering to prepare $Fe_{0.7}$—$Ni_{0.3}$/spinel (100) (Ni=30%) (a Ni film of 300 nm, and a Fe film 700 nm) in a similar procedure as in Example 1 except that a spinel substrate having a (100) plane was used as the single crystal substrate.

A h-BN thin film was synthesized by a CVD method under similar conditions as in Example 1 except that the $Fe_{0.7}$—$Ni_{0.3}$/spinel (100) (Ni=30%) substrate was used, and nitrogen gas was mixed at 25% with the hydrogen gas to be used in supplying a borazine vaporized gas as a raw material and in performing the cooling, and the generated h-BN was transferred onto a $SiO_2$/Si substrate in a similar manner as in Example 1.

Figure 15:
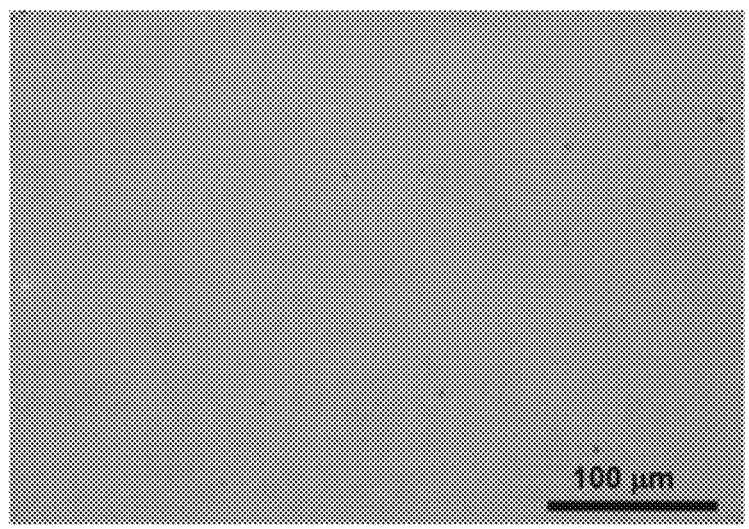
FIG. 15 shows an optical microscope image of the h-BN synthesized with Fe$_{0.7}$—Ni$_{0.3}$/spinel (100) (Ni=30%). The scale bar in the image is 100 μm.

The h-BN after transfer onto a $SiO_2$/Si substrate was analyzed with an optical microscope. As shown in FIG. 15, a microscope image having a substantially uniform optical contrast was obtained, and it was confirmed that the h-BN having high crystallinity was generated.

Figure 16:
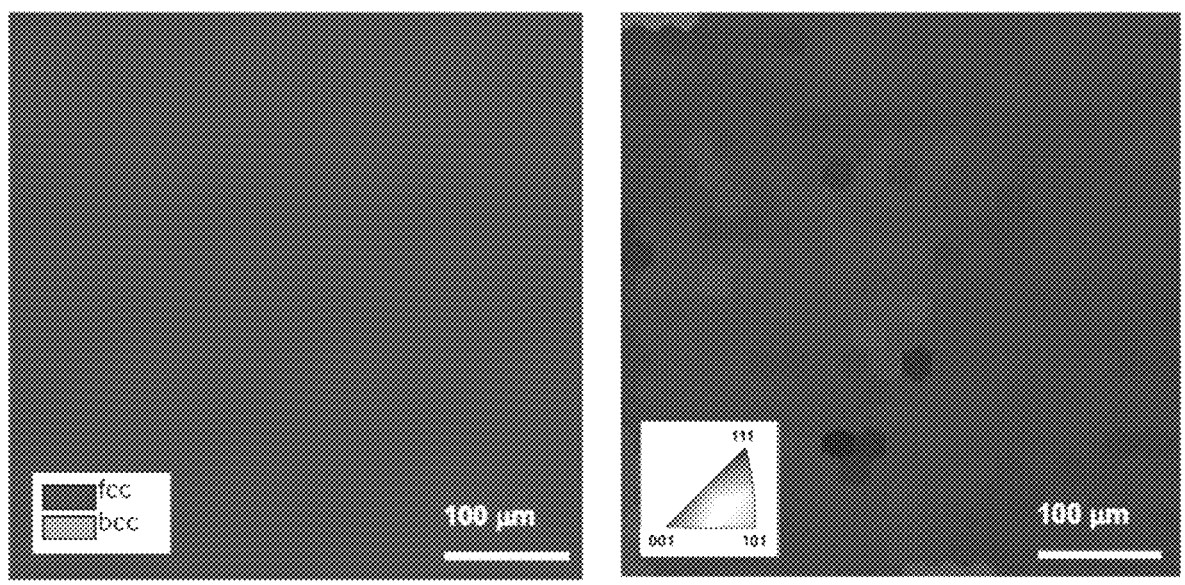
FIG. 16 shows EBSD images of the Fe$_{0.7}$—Ni$_{0.3}$/spinel (100) (Ni=30%) after CVD. The left shows a phase distribution map, and the right shows a crystal orientation map.

Further, the EBSD of $Fe_{0.7}$—$Ni_{0.3}$/spinel (100) (Ni=30%) was measured after the CVD. As shown in FIG. 16, in a case of the $Fe_{0.7}$—$Ni_{0.3}$/spinel (100) (Ni=30%), a uniform crystal orientation corresponding to a fcc (111) plane was obtained.

Example 3

Figure 17:
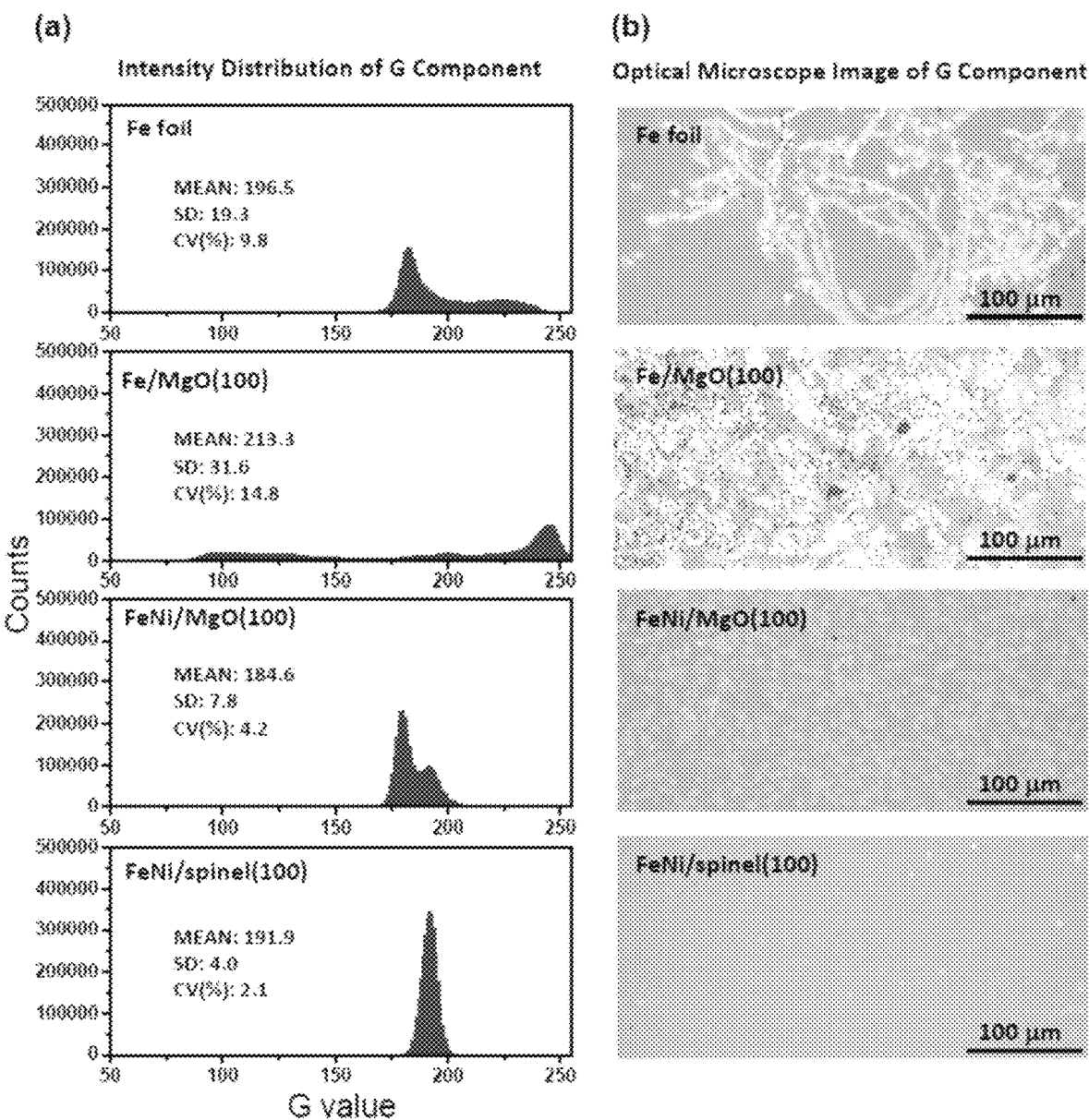
FIGS. 17(a) and 17(b) show measurement results of distribution of a G component of the RGB images obtained with an optical microscope with respect to the h-BN after transfer onto SiO$_2$/Si substrates obtained with Fe foil, Fe/MgO (100), Fe$_{0.3}$—Ni$_{0.7}$/MgO (100) (Ni=70%), and $Fe_{0.3}$—$Ni_{0.7}$/spinel (100) (Ni=70%).

Next, for the h-BN after transferred onto each of the $SiO_2$/Si substrates obtained with a Fe foil, Fe/MgO (100), and $Fe_{0.3}$—$Ni_{0.7}$/MgO (100) (Ni=70%) (Example 1), and the h-BN after transferred onto a $SiO_2$/Si substrate obtained with $Fe_{0.3}$—$Ni_{0.7}$/spinel (100) (Ni=70%) (Example 2-1), the distribution of the G component of a RGB image obtained with an optical microscope was measured. FIG. 17(a) shows graphs showing the intensity distribution of the G component extracted from the RGB image, and FIG. 17(b) shows G component images of the RGB image obtained with an optical microscope. In the present Example, around 30,000 points were arbitrarily selected from each of the RGB images, and the value of the G component was measured in each of the points. FIG. 17(a) shows the average (MEAN), the standard deviation (SD), the coefficient of variation (CV (%)) of each of the G component intensities. In FIG. 17(a), the peak observed in the vicinity of the G value of 170 to 185 is a peak derived from the oxide ($SiO_2$) of the Si substrate.

In a case of a Fe foil, a peak derived from the Si substrate was observed, and the distribution of the G component intensity was broad. Further, in a case of Fe/MgO (100), the rise of distribution that seems to be derived from the h-BN was observed in the vicinity of the G value of 230 to 250, however, the intensity distribution was in a range broader than that in a case of the Fe foil. In contrast, in a case of $Fe_{0.3}$—$Ni_{0.7}$/MgO (100) (Ni=70%), the intensity distribution of a G component became bimodal, and in a case of $Fe_{0.3}$—$Ni_{0.7}$/spinel (100) (Ni=70%), the obtained intensity distribution was unimodal. From these results, in a case when a stacked film of Fe and Ni was used, it was confirmed that the h-BN thin film having excellent uniformity is formed.

Reference Example 2

In order to examine the relationship between the crystal plane of a single crystal substrate for depositing a film of a metal catalyst and the formation of h-BN, films of a Fe metal and a Ni metal were deposited on a surface of a substrate by sputtering in a similar procedure as in Example 1 except that a MgO substrate (MgO (111)) having a (111) plane, and a spinel substrate (spinel (111)) having a (111) plane were used to prepare each of $Fe_{0.3}$—$Ni_{0.7}$/MgO (111) (Ni=70%) and $Fe_{0.3}$—$Ni_{0.7}$/spinel (111) (Ni=70%).

By using each of the $Fe_{0.3}$—$Ni_{0.7}$/MgO (111) (Ni=70%) and $Fe_{0.3}$—$Ni_{0.7}$/spinel (111) (Ni=70%) substrates, a h-BN thin film was synthesized by a CVD method under similar conditions as in Example 1, and the generated h-BN was transferred onto a $SiO_2$/Si substrate in a similar manner as in Example 1. In this regard, in the CVD reaction on the $Fe_{0.3}$—$Ni_{0.7}$/spinel (111) (Ni=70%) substrate, nitrogen gas was mixed at 25% with the hydrogen gas to be used in supplying a borazine vaporized gas as a raw material and in performing the cooling.

As a result of analyzing the h-BN after transfer onto a $SiO_2$/Si substrate with an optical microscope, it was confirmed that the h-BN film is formed, however, the amount of the generated h-BN was smaller as compared with that in a case of using MgO and spinel having a (100) plane. In the present invention, these results are considered to suggest that in the generation of boron nitride by a CVD method in which a metal thin film formed on a substrate was used as a catalyst, by correlating a factor of a crystal plane of a metal catalyst, and the like, and further a factor regarding a crystal plane of a substrate with each other, the desired hexagonal boron nitride thin film was obtained.

Example 4

Next, the relationship between the cooling rate and the h-BN generation amount was examined by using the $Fe_{0.7}$—$Ni_{0.3}$/MgO (100) (Ni=30%) that was used in Example 1, and by changing the cooling rate in CVD to 5° C./min, 2.5° C./min, and 1° C./min. The results are shown in FIGS.

Figure 18:
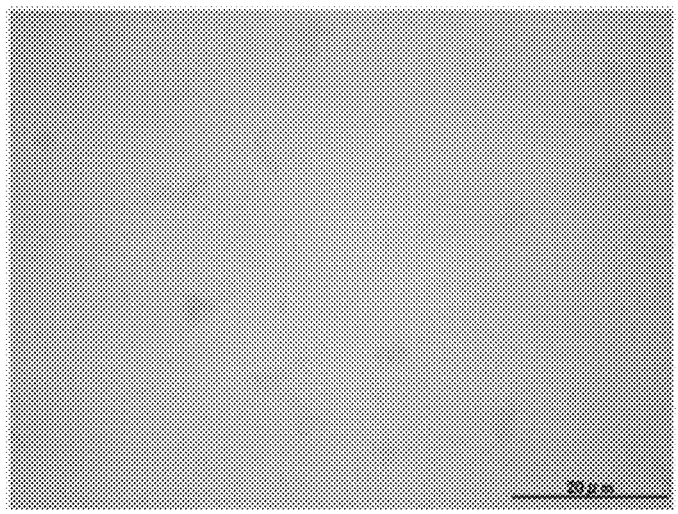
FIGS. 18(a)-18(c) show optical microscope images of the h-BN synthesized by using a $Fe_{0.7}$—$Ni_{0.3}$/MgO (100) (Ni=30%) substrate and changing the cooling rate in CVD.
Figure 18:
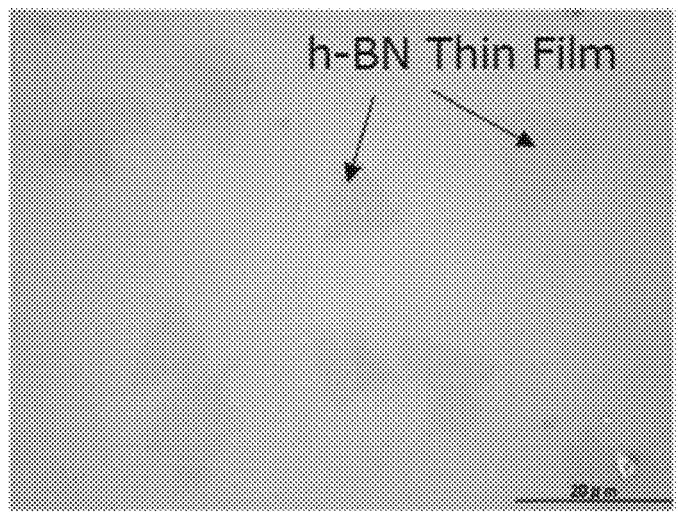
Figure 18:
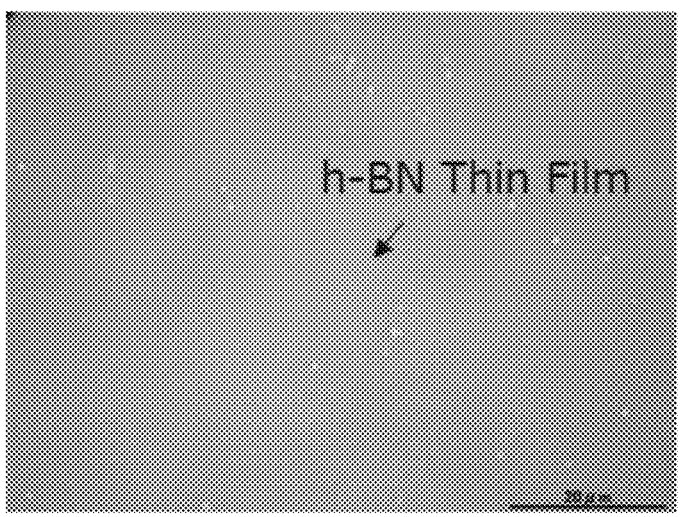

18(*a*)-18(*c*). As compared with the h-BN thin film in a case where the cooling rate was 5° C./min (FIG. 18(*a*)), h-BN thin film was more widely observed at a cooling rate of 2.5° C./min (FIG. 18(*b*)) and at a cooling rate of 1° C./min (FIG. 18(*c*)). In these two cases, the formation amount of the h-BN thin film was higher at a cooling rate of 1° C./min than that at a cooling rate of 2.5° C./min. From these results, it is suggested that the cooling rate in CVD is one of the factors that significantly affect the h-BN generation amount, and as the cooling rate is slower, the more uniform and larger h-BN thin film can be obtained.

Example 5-1

By using three kinds of metal foils having the following compositions in place of the Fe—Ni stacked film (metal catalyst) formed on a single crystal substrate used in Example 1, a h-BN thin film was synthesized by a CVD method.
(1) Super Invar (Fe Rich)
  Fe: balance (63 to 65%)
  Ni: 31%
  Co: 4 to 6%
(2) 42 Invar (Fe Rich)
  Fe: balance (56 to 57%)
  Ni: around 42%
  Co: 1 to 2%
(3) 78 Permalloy (Ni Rich)
  Fe: balance (around 16 to 17%)
  Ni: around 78%
  Co: 1 to 2%
  Mo: 4%

At first, a h-BN thin film was synthesized by a CVD method under similar conditions as in Example 1 except that the cooling rate in CVD was changed to 5° C./min. The results are shown in FIGS. 19(*a*)-19(*c*).

Figure 19:
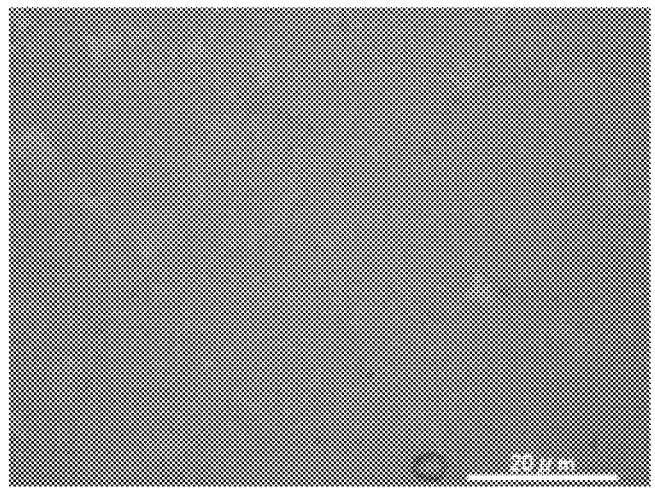
FIGS. 19(a)-19(c) show optical microscope images of the h-BN synthesized by using three kinds of metal foils and changing the cooling rate in CVD.
Figure 19:
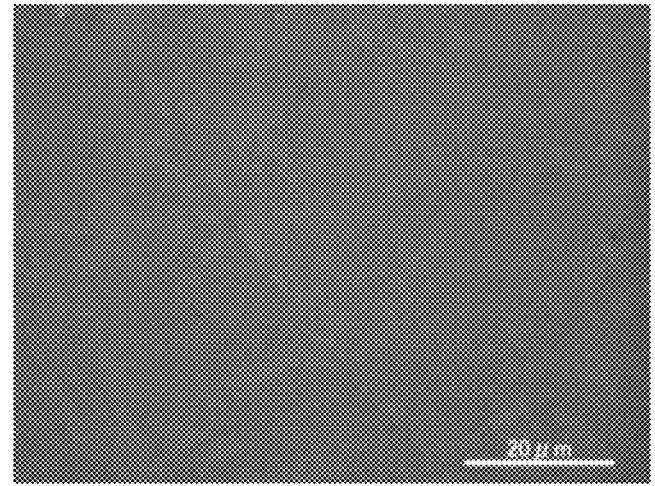
Figure 19:
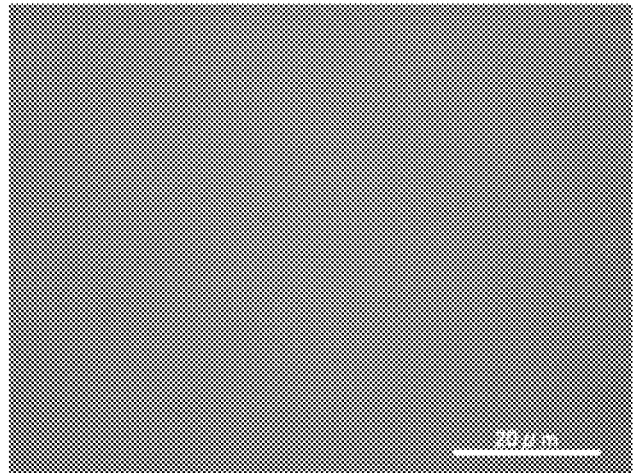

From the optical microscope images shown in FIGS. 19(*a*) to 19(*c*), the generation of h-BN was confirmed in any one of the metal foils, and in the order of the super invar (FIG. 19(*a*)), the 42 invar (FIG. 19(*b*)), and the 78 permalloy (FIG. 19(*c*)), the amount of generated h-BN is decreased, and a tendency that the extension of the h-BN areas is suppressed was observed.

Next, a h-BN thin film was synthesized by a CVD method under similar conditions as in Example 1 except that the cooling rate in CVD was changed to 1° C./min. The results are shown in FIGS. 20(*a*)-20(*c*).

Figure 20:
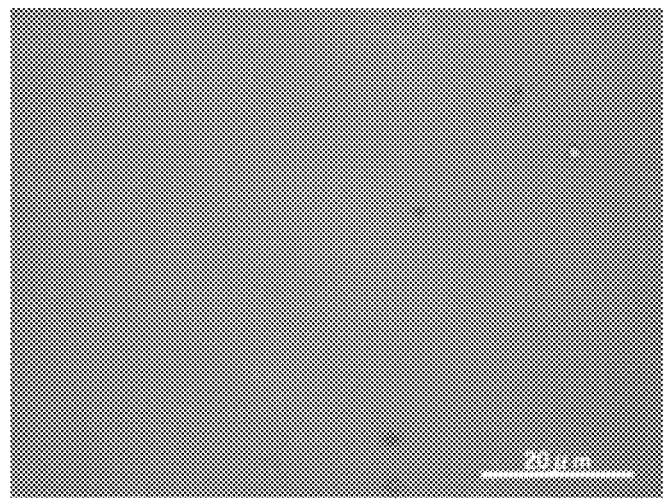
FIGS. 20(a)-20(c) show optical microscope images of the h-BN synthesized by using three kinds of metal foils and setting the cooling rate to be 1° C./min in CVD.
Figure 20:
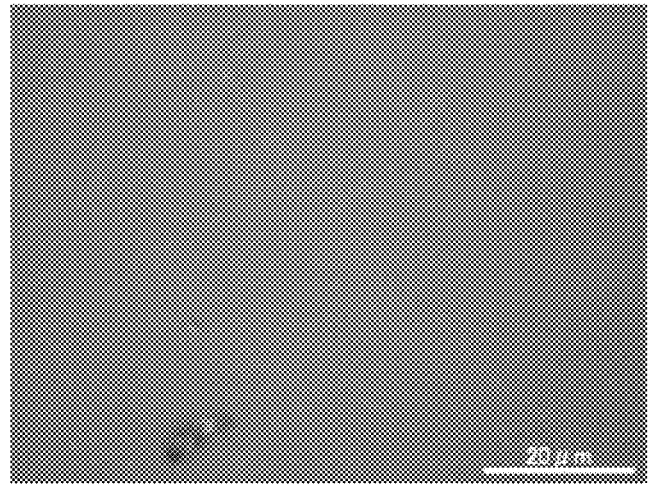
Figure 20:
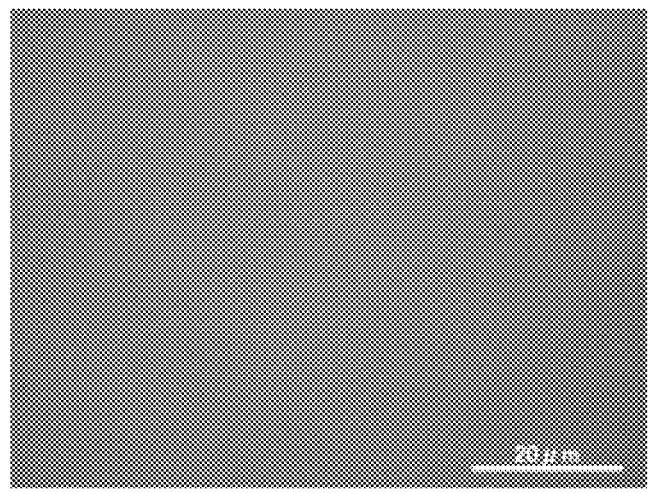

From the optical microscope images shown in FIGS. 20(*a*) to 20(*c*), the generation of h-BN was confirmed in all the metal foils. In addition, as compared with the case where the cooling rate was 5° C./min (FIGS. 19(*a*)-19(*c*)), the higher coverage of the generated h-BN was observed. In particular, in the super invar, the entire surface of the metal foil was covered with a multi-layered h-BN film. This suggests that the cooling rate in CVD is one of the factors that affect the h-BN generation amount, and when the cooling rate is decreased, the amount of generated h-BN is increased, and the more uniform and extending h-BN thin film can be formed.

Next, a h-BN thin film was synthesized by a CVD method under similar conditions as in Example 1 except that super invar was used, and the cooling rate from the synthesis temperature in CVD to 700° C. was changed to the following four different ways of (i) to (iv):
  (i) a rate of 5° C./min to cool to 700° C.;
  (ii) a rate of 1° C./min to cool to 700° C.;
  (iii) a rate of 0.5° C./min to cool to 900° C., and then at 5° C./min to cool to 700° C.; and
  (iv) at 0.25° C./min to cool to 1050° C., and then at 5° C./min to cool to 700° C.

Figure 21:
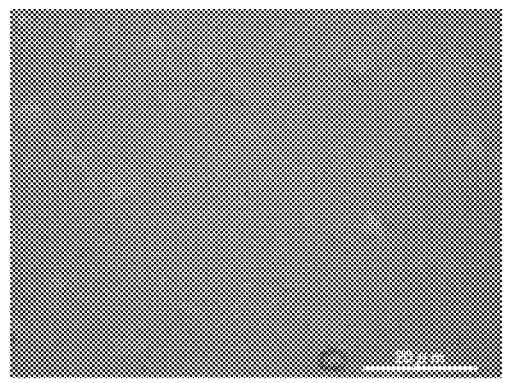
FIGS. 21(a)-21(d) optical microscope images of the h-BN synthesized by using a super invar of metal foil, and changing the cooling rate from the synthesis temperature in CVD to 700° C.
Figure 21:
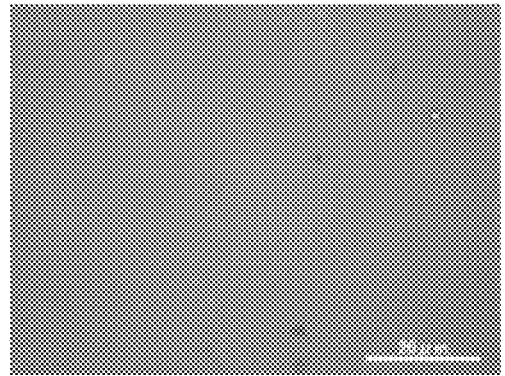
Figure 21:
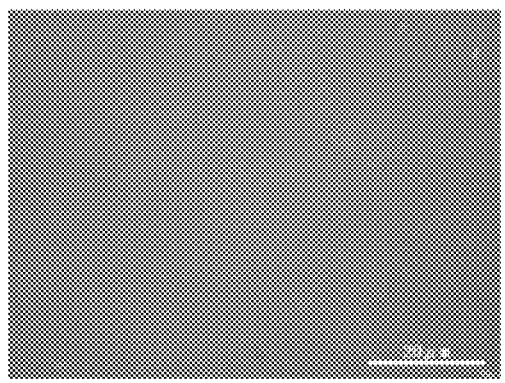
Figure 21:
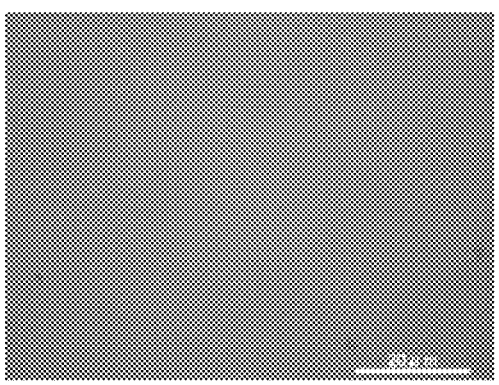

From the optical microscope images shown in FIGS. 21(*a*) to 21(*d*), as the cooling rate from the synthesis temperature was decreased to 5° C./min, 1° C./min, 0.5° C./min, and 0.25° C./min, a h-BN thin film having more excellent uniformity was observed. This suggests that the cooling rate in a temperature range close to the synthesis temperature in an initial stage of the cooling process leads to the increase in the h-BN amount and to the formation of a more uniform and larger h-BN thin film. In particular, FIG. 21(*d*) shows that the uniformity of the h-BN was extremely improved, and the h-BN having high quality was able to be synthesized.

Figure 22:
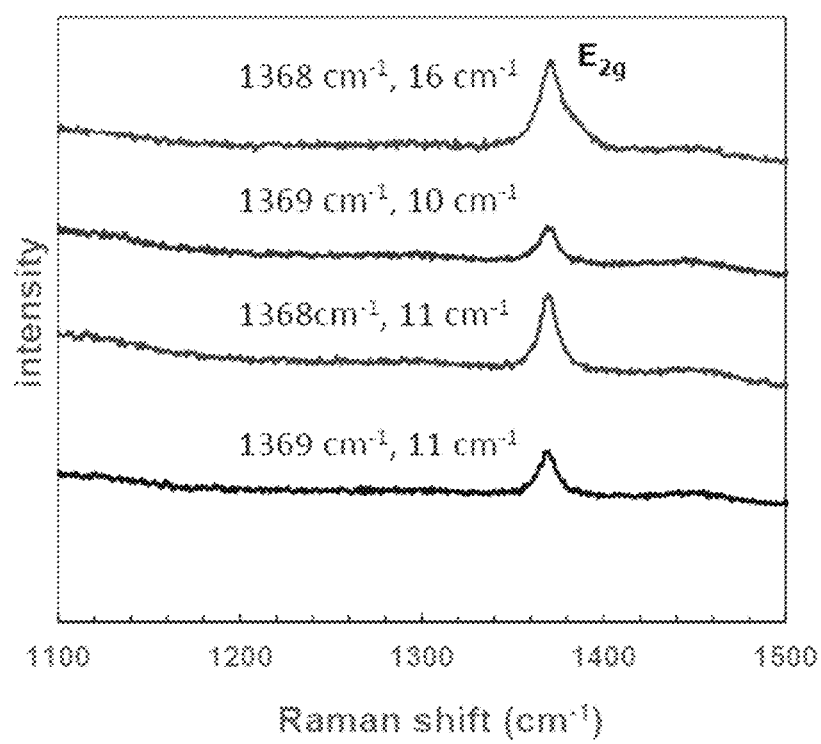
FIGS. 22(a) and 22(b) show measurement results of the Raman spectrum of the h-BN synthesized by using a super invar foil and setting the cooling rate to be 1° C./min in CVD. The wave numbers in the Raman spectrum of FIG. 22(a) represent the position and the full width at half maximum of the $E_{2g}$ peak derived from the h-BN.
Figure 22:
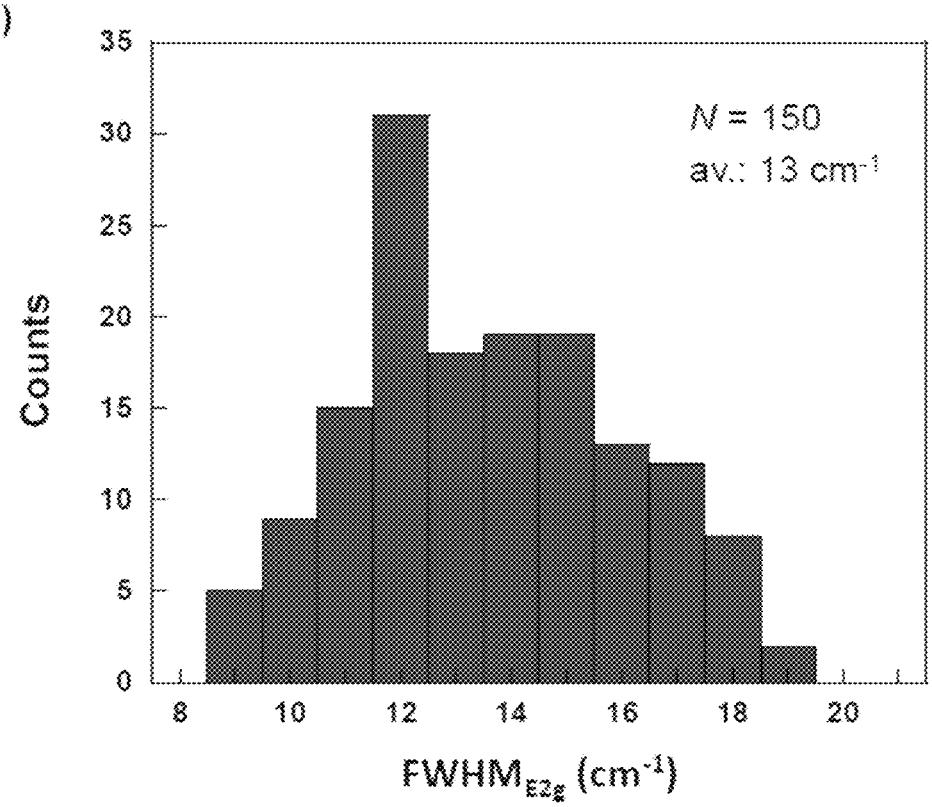

FIGS. 22(*a*) and 22(*b*) show measurement results of the Raman spectrum of the h-BN synthesized under the condition of the above-described (ii). As shown in FIG. 22(*a*), the $E_{2g}$ peaks derived from the h-BN were confirmed at 1368 to 1369 $cm^{-1}$, and it can be understood that the crystallinity was favorable from the values of the full width at half maximum. Further, 150 places were randomly selected from a 20 μm square area of the h-BN, and the intensity and the full width at half maximum (FWHM) of the $E_{2g}$ peak derived from the h-BN were measured. As shown in FIG. 22(*b*), because the average value of the FWHM of the $E_{2g}$ peak was 13 $cm^{-1}$, it was confirmed that the h-BN had high crystallinity.

Example 5-2

A h-BN thin film was synthesized by using the super invar used in Example 5-1 and by changing the temperature profile of the CVD synthesis. Specifically, the temperature was raised to 1100° C. in 60 minutes, and the temperature of 1100° C. was retained for 40 minutes as shown in FIG. 1, and then the temperature was raised to 1150° C. over 20 minutes, and the CVD reaction was performed at the temperature for 30 minutes in a similar procedure as in Example 1. After that, the cooling was performed at a rate of 5° C./min until the temperature reached 700° C., and after the temperature reached 700° C., the tubular furnace was turned off and cooled to room temperature.

Figure 23:
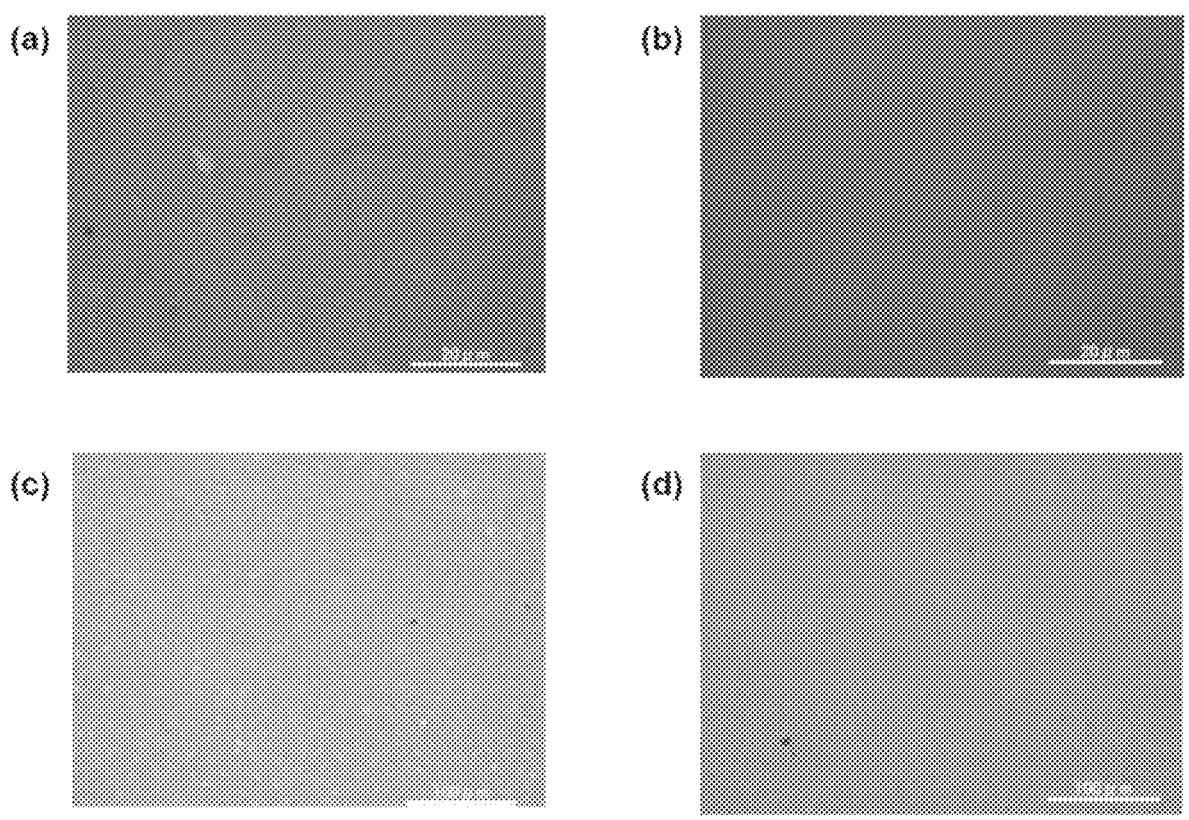
FIGS. 23(a)-23(d) show optical microscope images of the h-BN synthesized by using a super invar foil, and changing the reaction temperature in CVD.

FIGS. 23(*a*)-23(*d*) show optical microscope images of the h-BN after transferred onto a $SiO_2$/Si substrate. FIGS. 23(*a*) and 23(*c*) show images at high magnification and at low magnification of the h-BN synthesized under the condition of (i) in Example 5-1, and FIGS. 23(*b*) and 23(*d*) show images at high magnification and at low magnification of the h-BN synthesized in the present Example. From the images shown in FIGS. 23(*a*) to 23(*d*), as compared with the h-BN generated under the condition of (i) in Example 5-1, in the h-BN synthesized in the present Example, a tendency that the grain size of the h-BN increases, the nucleation point decreases, and the nonuniformity of h-BN is suppressed was observed. These results suggest that the reaction temperature (temperature profile) in CVD is one of the factors that affect the generation of the h-BN having higher quality. In addition, in the h-BN synthesized in the present Example, even in a state that the h-BN is generated on a metal foil after completion of the CVD reaction and before transferred onto a $SiO_2$/Si substrate, as compared with the h-BN synthesized under the condition of (i) in Example 5-1, a tendency that the nonuniform precipitation of the h-BN was suppressed was observed in an optical microscope image, and it was confirmed that the h-BN film was more excellent in terms of the uniformity.

Example 6

By the way, it can be interpreted that the above results with regard to FIGS. 2(a)-2(e) and 3(a)-3(e) are obtained by dissolving boron and nitrogen as a solid solution in Fe, generating h-BN when the boron and nitrogen are precipitated during cooling, and forming a thin film on a substrate. That is, since the degree of dissolution of boron and nitrogen in Fe is sufficiently high, a h-BN thin film having a relatively large thickness is formed. On the other hand, the amount of the dissolved nitrogen in Ni is small, and therefore, it can be interpreted that a h-BN thin film having a relatively small thickness and a low density is formed.

In order to confirm the assumptions described above, in the CVD synthesis using the $Fe_{0.3}$—$Ni_{0.7}$/MgO (100) (Ni=70%) substrate shown in FIG. 2(d), the half in the 10 sccm of hydrogen to be flowed during synthesis and cooling was replaced with nitrogen gas. As a result, the generation amount of the h-BN was increased as compared with that in a case of hydrogen gas alone. This can be inferred that the amount of the dissolved nitrogen in Ni is smaller than that in a case of Fe, and the amount being deficient is compensated by the nitrogen gas in a gas.

Example 7

Figure 24:
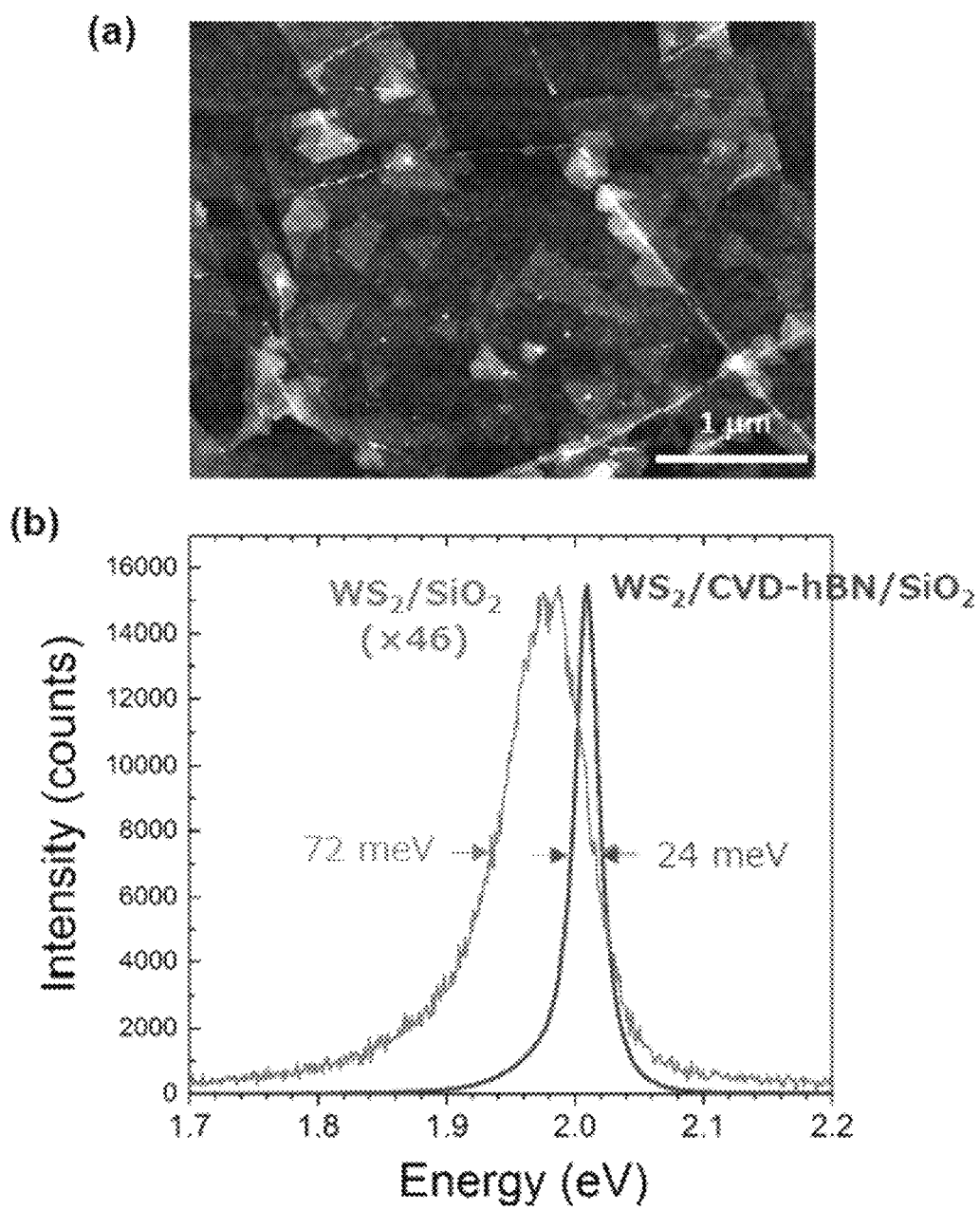
FIG. 24(a) shows an atomic force microscope image of a $WS_2$ atomic film synthesized by a CVD method on the h-BN synthesized by using a $Fe_{0.3}$—$Ni_{0.7}$/MgO (100) (Ni=70%) substrate.
FIG. 24(b) shows fluorescence spectra of $WS_2$ atomic films synthesized by a CVD method on the h-BN synthesized by using a $Fe_{0.3}$—$Ni_{0.7}$/MgO (100) (Ni=70%) substrate and a $SiO_2$/Si substrate.

Next, in order to demonstrate that the h-BN thin film synthesized by a CVD method is effective as an insulating material for other atomic layered materials, an atomic film of $WS_2$ was synthesized by a CVD method on the h-BN synthesized by using a $Fe_{0.3}$—$Ni_{0.7}$/MgO (100) (Ni=70%) substrate and on a $SiO_2$/Si substrate, and the fluorescence spectrum was evaluated. For the synthesis of $WS_2$, $WO_3$ and sulfur powder were used as raw materials, the temperature was independently controlled to sublime the materials, and the substrate was heated to 800° C. to grow the crystals. FIG. 24(a) shows an atomic force microscope image of the $WS_2$ grown on h-BN. It can be understood from the triangular shape that the $WS_2$ was thin and grew as small single crystals.

Figure 25:
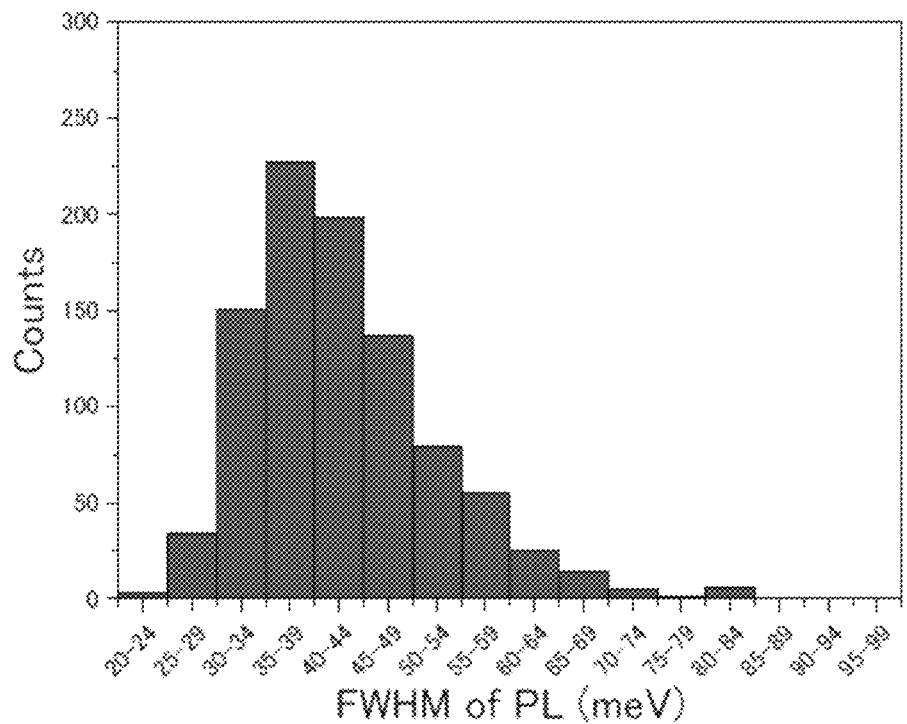
FIGS. 25(a) and 25(b) show histograms of the full width at half maximum of the fluorescence spectra shown in FIG. 24(b).
Figure 25:
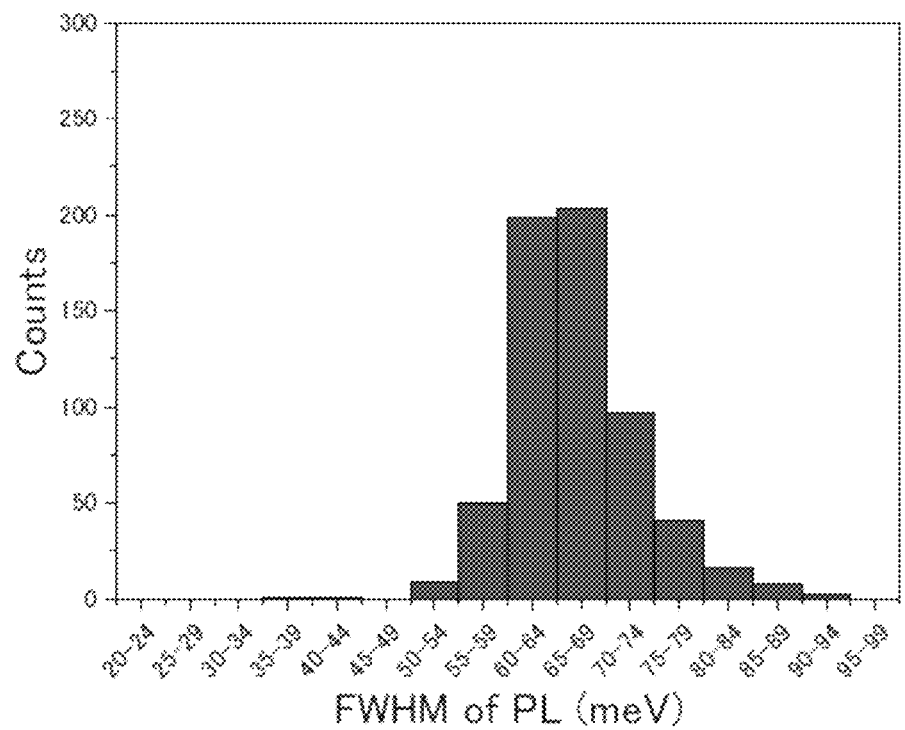
Figure 26:
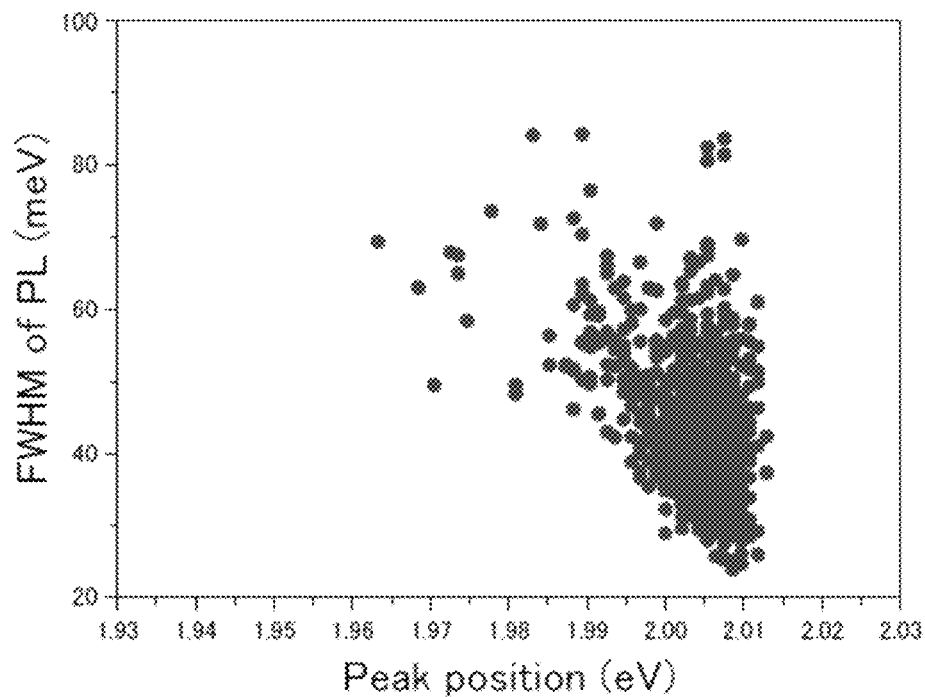
FIGS. 26(a) and 26(b) show scatter graphs which plot the full width at half maximum against the peak position of the fluorescence from $WS_2$. These graphs are made based on FIG. 25.
Figure 26:
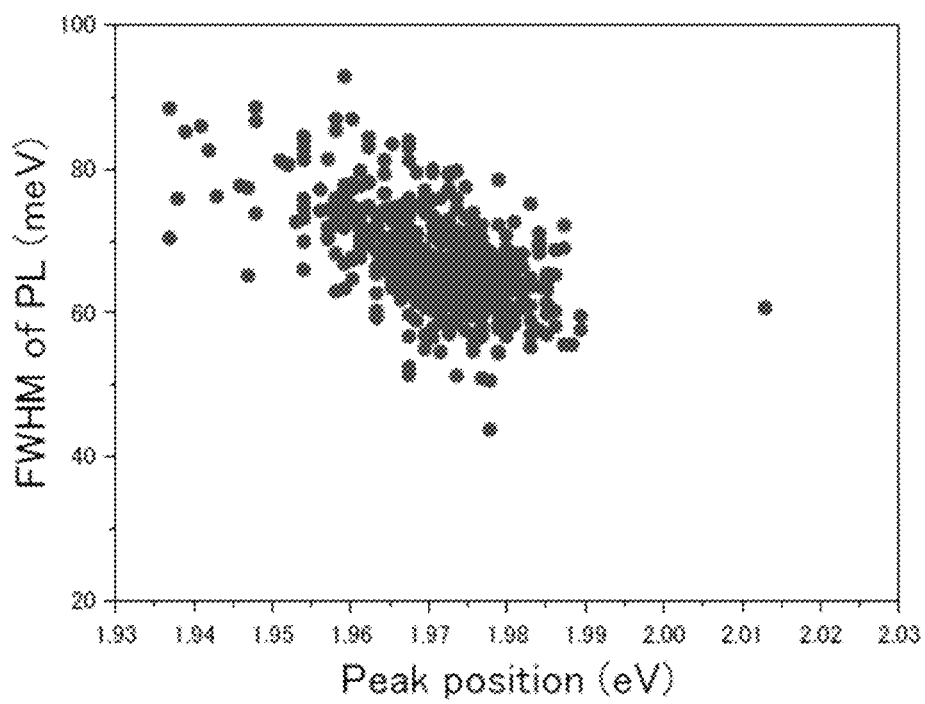

$WS_2$ was allowed to grow also on $SiO_2$/Si under the same conditions, and then each of the fluorescence spectra of the $WS_2$ on h-BN and the $WS_2$ on $SiO_2$ was measured. For the measurement, Nanofinder 30 described above was used, and the wavelength of the excitation light was also set to 532 nm. FIG. 24(b) shows the results of the fluorescence spectra. It can be understood that the peak intensity of the $WS_2$ grown on h-BN is strong and 46 times stronger than that of the $WS_2$ grown on $SiO_2$. Further, it can be understood that the line width of photoluminescence (PL) of the $WS_2$ on h-BN is extremely narrow from 72 meV on $SiO_2$ to 24 meV on h-BN. FIGS. 25(a) and 25(b) show histograms of the full width at half maximum of the fluorescence spectra shown in FIG. 24(b). From the histograms shown in FIGS. 25(a) and 25(b), it is quantitatively understood that the line width of PL of the $WS_2$ on h-BN is narrower than that of the $WS_2$ grown on $SiO_2$. The increase in the intensity of fluorescence and the sharpening in the peak in the $WS_2$ are indicated that with the h-BN thin film synthesized in the present Example, influences of the surface roughness of the $SiO_2$ substrate, the charge impurities, the optical phonon, and the like can be well screened. FIGS. 26(a) and 26(b) show scatter plot graphs obtained by adding the information of the peak positions in the fluorescence spectra of FIG. 24(b) to the information of the histograms of FIGS. 25(a) and 25(b). In the scatter plot graphs shown in FIGS. 26(a) and 26(b), it is indicated that as the peak position of the fluorescence spectrum shifts to the lower energy side, the influence of charge impurities on the $SiO_2$ substrate is increased. More specifically, the fluorescence from excitons is in the vicinity of 2.01 eV, and the fluorescence from the negative trion derived from the negative charge on the $SiO_2$ surface is mixed in the vicinity of 1.98 eV. That is, also from these scatter plot graphs, it was confirmed that the $WS_2$ on h-BN was less susceptible to the charge impurities of the $SiO_2$ substrate. These results indicate that the h-BN thin film produced according to the present invention has an advantage of increasing the area by a CVD method, and further can be applied with excellent properties as a substrate material for various atomic layered materials.

Example 8

Next, a single layer graphene film formed by a CVD method was transferred onto each of the h-BN synthesized by using super invar of a metal foil and the $SiO_2$/Si, and the properties of the graphene were analyzed by a Raman spectrum. In this regard, the single layer graphene film was formed on Cu (111) on a sapphire substrate by a CVD method, and then a polymethyl methacrylate (PMMA) solution was spin coated on a surface of the single layer graphene film, and one obtained by removing Cu by etching was transferred onto the h-BN or the $SiO_2$/Si.

Figure 27:
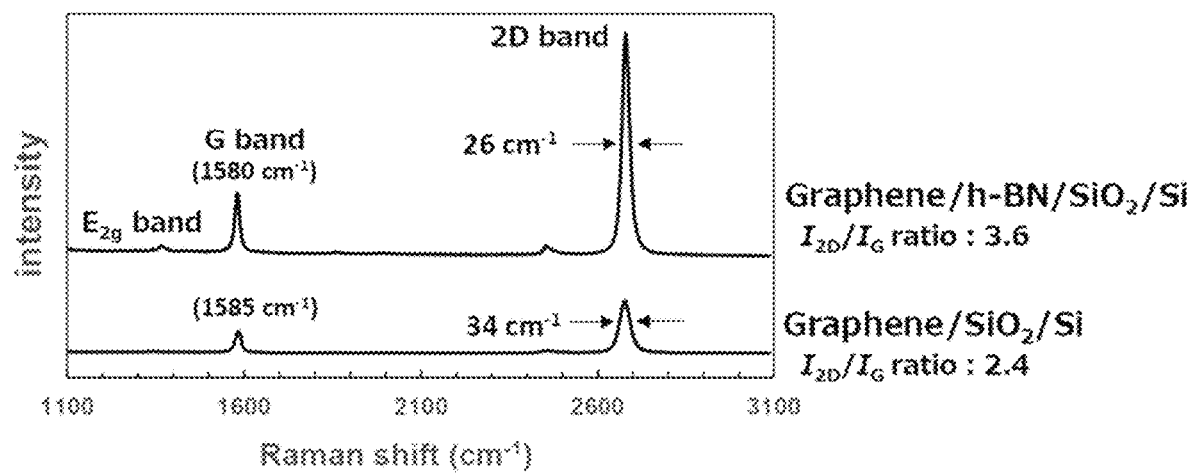
FIG. 27 shows measurement results of Raman spectra of the single layer graphene stacked on the h-BN synthesized by using a super invar foil, and the single layer graphene transferred onto $SiO_2$/Si.

As shown in FIG. 27, the full width at half maximum (26 $cm^{-1}$) of the 2D band of the graphene on the h-BN (spectrum on the upper side) is narrower than the full width at half maximum (34 $cm^{-1}$) of the graphene (spectrum on the lower side) on the $SiO_2$/Si, and it can be understood that the influence from the $SiO_2$ is significantly decreased by the h-BN. Further, when comparing the intensity ratio ($I_{2D}/I_G$) of the 2D band to the G band between the graphene on the h-BN and the graphene on the $SiO_2$/Si, since the intensity ratio of the graphene on the h-BN is 3.6, and the intensity ratio of the graphene on the $SiO_2$/Si is 2.4, it can be understood that the graphene on the h-BN is in a more ideal state to exhibit the properties. The full width at half maximum (26 $cm^{-1}$) of the 2D band of the graphene on the h-BN has a value almost the same degree with the value previously reported for the graphene on the h-BN exfoliated from a bulk single crystal, and thus it is indicated that the h-BN of the present invention has a screening effect almost the same degree as that of exfoliated one.

Figure 28:
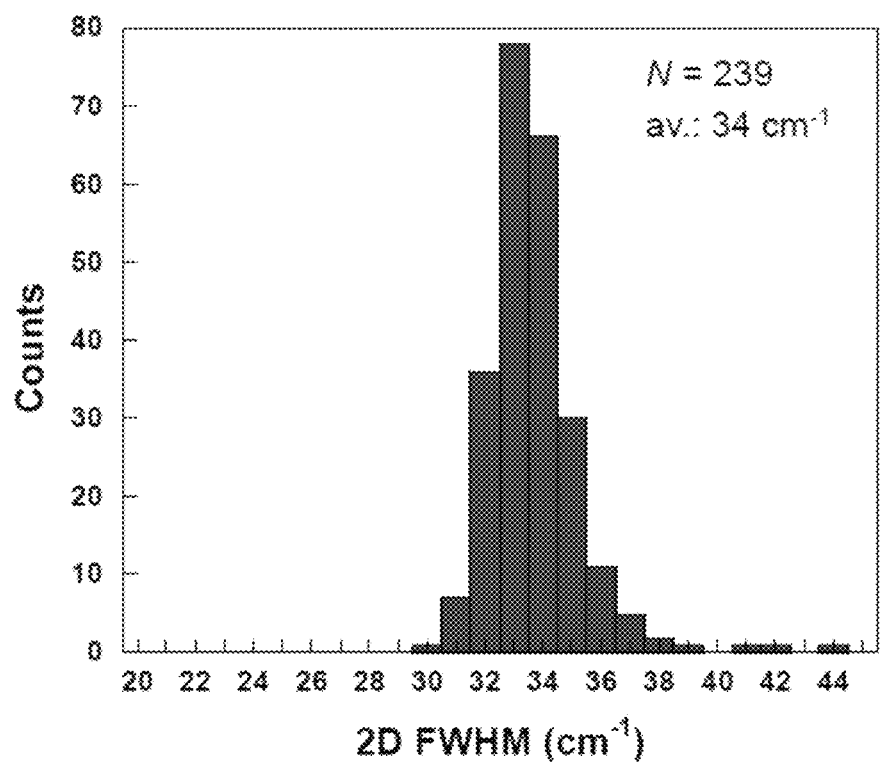
FIG. 28 shows histograms showing the distribution of the full width at half maximum (FWHM) of the 2D band measured at multiple points.
Figure 28:
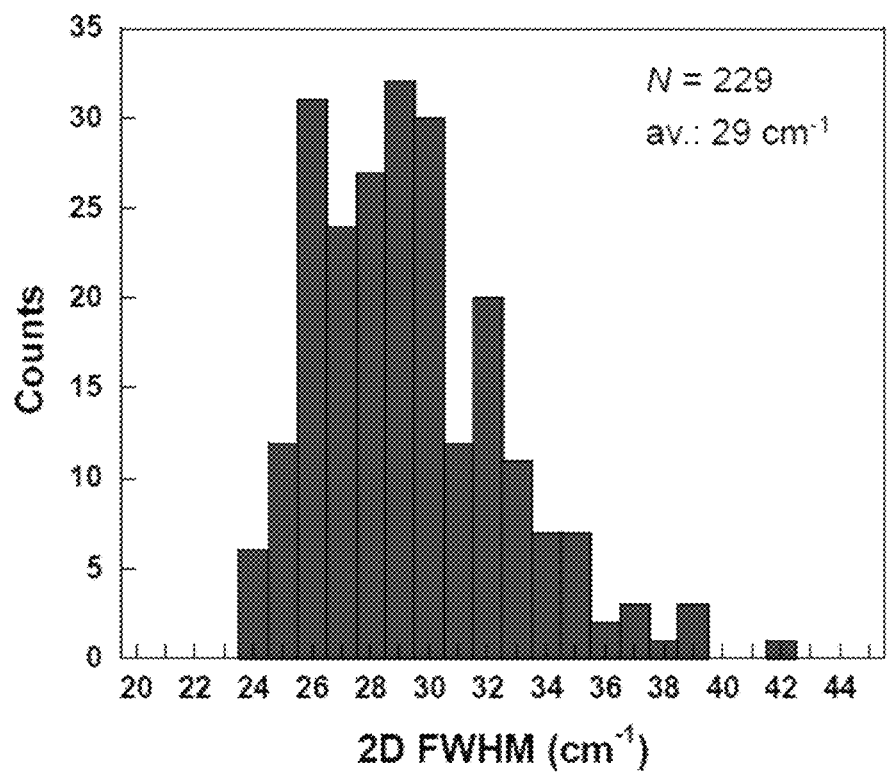

FIGS. 28(a) and 28(b) show histograms each showing the distribution of the full width at half maximum (FWHM) of the 2D band in multiple measurement points for each of the graphene on the h-BN and the graphene on the $SiO_2$/Si. In the graphene on the $SiO_2$/Si (FIG. 28(a)), the average FWHM in 239 places (N=239) was 34 $cm^{-1}$, but in contrast, in the graphene on the h-BN (FIG. 28(b)), the average FWHM in 229 places (N=229) was 29 $cm^{-1}$. As described above, by using the h-BN thin film synthesized by a CVD method according to the present invention, it was confirmed from multiple measurement points that the characteristics inherent in graphene can be exhibited more efficiently and effectively by using h-BN.

INDUSTRIAL APPLICABILITY

The hexagonal boron nitride thin film according to the present invention has the characteristics that the area is large, the thickness is uniform, and the crystallinity is high, and therefore can be used for a variety of electronic devices including a semiconductor device.

The invention claimed is:

1. A method for producing a hexagonal boron nitride thin film, comprising
    forming the hexagonal boron nitride thin film having a thickness of 1 nm or more on a surface of a metal thin film by a chemical vapor deposition (CVD) method including steps of,
        i) supplying raw material gas containing boron atoms, nitrogen atoms, or both of boron atoms and nitrogen atoms on the surface of the metal thin film at a CVD synthesis temperature, wherein the metal thin film contains Ni and Fe, Co and Fe, or Cr and Fe as main component elements, and
        ii) cooling the surface of the metal thin film from the CVD synthesis temperature after supplying the raw material gas for a predetermined period of time,
    wherein an average value of a full width at half maximum of an $E_{2g}$ peak obtained from a Raman spectrum is 9 to 20 $cm^{-1}$ as measured at one or more measuring points randomly selected from a 20 μm square area of the hexagonal boron nitride thin film, and
    wherein a coefficient of variation of an intensity distribution of a G component of an RGB image of the hexagonal boron nitride thin film on a silicon substrate having an oxide film obtained with an optical microscope is 5% or less, and wherein the intensity distribution of the G component is measured at plural measuring points randomly selected from the RGB image.

2. The method for producing a hexagonal boron nitride thin film according to claim 1, wherein the metal thin film contains Ni and Fe as main component elements, and a surface of the metal thin film has a (111) plane, a (100) plane, or a (110) plane of a face-centered cubic lattice.

3. The method for producing a hexagonal boron nitride thin film according to claim 2, wherein the metal thin film contains 10% or more of Ni.

4. The method for producing a hexagonal boron nitride thin film according to claim 1, wherein the metal thin film is formed on a single crystal substrate.

5. The method for producing a hexagonal boron nitride thin film according to claim 1, wherein the cooling process is performed at a rate of 0.01 to 2.5° C./min from the CVD synthesis temperature.

6. The method for producing a hexagonal boron nitride thin film according to claim 5, wherein the metal thin film contains Ni and Fe as main component elements, and a surface of the metal thin film has a (111) plane, a (100) plane, or a (110) plane of a face-centered cubic lattice.

7. The method for producing a hexagonal boron nitride thin film according to claim 6, wherein the metal thin film contains 10% or more of Ni.

8. The method for producing a hexagonal boron nitride thin film according to claim 5, wherein the metal thin film is formed on a single crystal substrate.

9. The method for producing a hexagonal boron nitride thin film according to claim 1, wherein the cooling process comprises slow cooling performed from the CVD synthesis temperature and rapid cooling performed after the slow cooling process.

10. The method for producing a hexagonal boron nitride thin film according to claim 9, wherein the metal thin film contains Ni and Fe as main component elements, and a surface of the metal thin film has a (111) plane, a (100) plane, or a (110) plane of a face-centered cubic lattice.

11. The method for producing a hexagonal boron nitride thin film according to claim 10, wherein the metal thin film contains 10% or more of Ni.

12. The method for producing a hexagonal boron nitride thin film according to claim 9, wherein the metal thin film is formed on a single crystal substrate.

13. The method for producing a hexagonal boron nitride thin film according to claim 1, wherein the metal thin film is a stacked film of metal films.

14. The method for producing a hexagonal boron nitride thin film according to claim 13, wherein the metal thin film contains Ni and Fe as main component elements, and a surface of the metal thin film has a (111) plane, a (100) plane, or a (110) plane of a face-centered cubic lattice.

15. The method for producing a hexagonal boron nitride thin film according to claim 14, wherein the metal thin film contains 10% or more of Ni.

16. The method for producing a hexagonal boron nitride thin film according to claim 13, wherein the metal thin film is formed on a single crystal substrate.

* * * * *